(12) United States Patent  
Sasaki et al.

(10) Patent No.: US 9,093,261 B2
(45) Date of Patent: Jul. 28, 2015

(54) METHOD OF MANUFACTURING SEMICONDUCTOR DEVICE

(71) Applicant: Kabushiki Kaisha Toshiba, Tokyo (JP)

(72) Inventors: Toshiyuki Sasaki, Mie (JP); Mitsuhiro Omura, Mie (JP); Kazuhito Furumoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/202,696

(22) Filed: Mar. 10, 2014

(65) Prior Publication Data

US 2015/0104942 A1    Apr. 16, 2015

(30) Foreign Application Priority Data

Oct. 10, 2013  (JP) .................. 2013-212803

(51) Int. Cl.
  *H01L 21/311*  (2006.01)
  *H01L 21/02*   (2006.01)
  *H01L 21/3065* (2006.01)
  *H01L 21/308*  (2006.01)

(52) U.S. Cl.
  CPC ...... *H01L 21/02071* (2013.01); *H01L 21/3065* (2013.01); *H01L 21/3086* (2013.01)

(58) Field of Classification Search
  CPC ................. H01L 21/02071; H01L 21/3065; H01L 21/3086
  USPC .......................... 438/695, 720, 729, 738, 742
  See application file for complete search history.

(56) References Cited

U.S. PATENT DOCUMENTS 6,164,295  A    12/2000  Ui et al.
7,204,913  B1 *  4/2007  Singh et al. .............. 156/345.51
(Continued)

FOREIGN PATENT DOCUMENTS

JP    61-289634    12/1986
JP    2-86127      3/1990
(Continued)

OTHER PUBLICATIONS

English translation of Notification of Reason(s) for Refusal issued by the Japanese Patent Office on Jan. 6, 2015, in counterpart Japanese Patent Application No. 2013-212803.

*Primary Examiner* — Binh X Tran

(74) *Attorney, Agent, or Firm* — Finnegan, Henderson, Farabow, Garrett & Dunner, L.L.P.

(57) ABSTRACT

A method of manufacturing a semiconductor device includes processing a semiconductor substrate using a plasma etching apparatus provided with a processing chamber. The semiconductor substrate has an uneasily-etched material formed thereabove and at least an upper layer film formed above the uneasily-etched material. The method includes etching the upper layer film after loading the semiconductor substrate into the processing chamber; forming a lift-off layer along an inner wall of the processing chamber with the semiconductor substrate loaded in the processing chamber; etching the uneasily-etched material and causing deposition of a reactive product of the uneasily-etched material along the lift-off layer; and cleaning, by removing the reactive product by removing the lift-off layer, the inner wall of the processing chamber after the semiconductor substrate is unloaded from the plasma etching apparatus.

20 Claims, 21 Drawing Sheets

(56) References Cited

U.S. PATENT DOCUMENTS

| | | |
|---|---|---|
| 2003/0008517 A1* | 1/2003 | Ko et al. .................... 438/710 |
| 2003/0092272 A1* | 5/2003 | Dutra et al. ................. 438/694 |
| 2005/0072444 A1 | 4/2005 | Shirayone et al. |
| 2006/0286806 A1 | 12/2006 | Ohkuni et al. |
| 2007/0232067 A1* | 10/2007 | Hirota et al. ............... 438/689 |
| 2009/0317977 A1* | 12/2009 | Takase ........................ 438/703 |
| 2011/0226734 A1* | 9/2011 | Sumiya et al. ............... 216/41 |
| 2013/0115418 A1* | 5/2013 | Young-Dohe et al. ........ 428/141 |

FOREIGN PATENT DOCUMENTS

| | | |
|---|---|---|
| JP | 6-267897 | 9/1994 |
| JP | 7-130706 | 5/1995 |
| JP | 10-50685 | 2/1998 |
| JP | 2003-297817 | 10/2003 |
| JP | 2004-79557 | 3/2004 |
| JP | 2007-5381 | 1/2007 |

\* cited by examiner

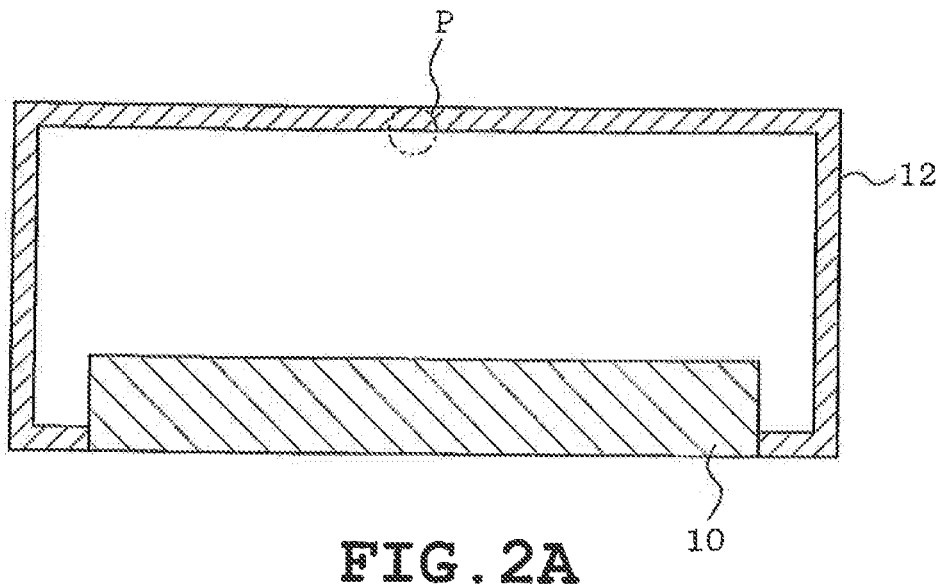
FIG.2B
FIG.2A
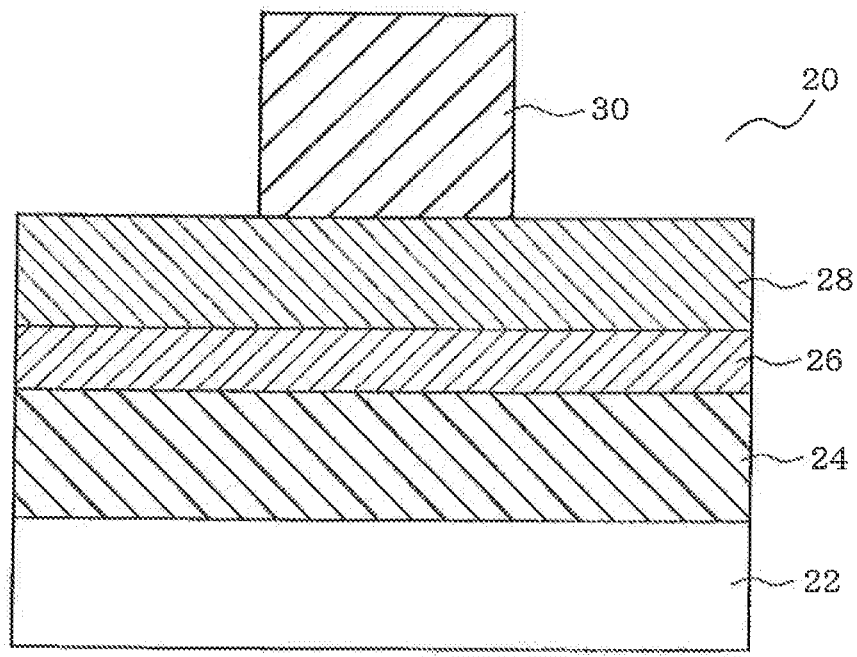
FIG.2C

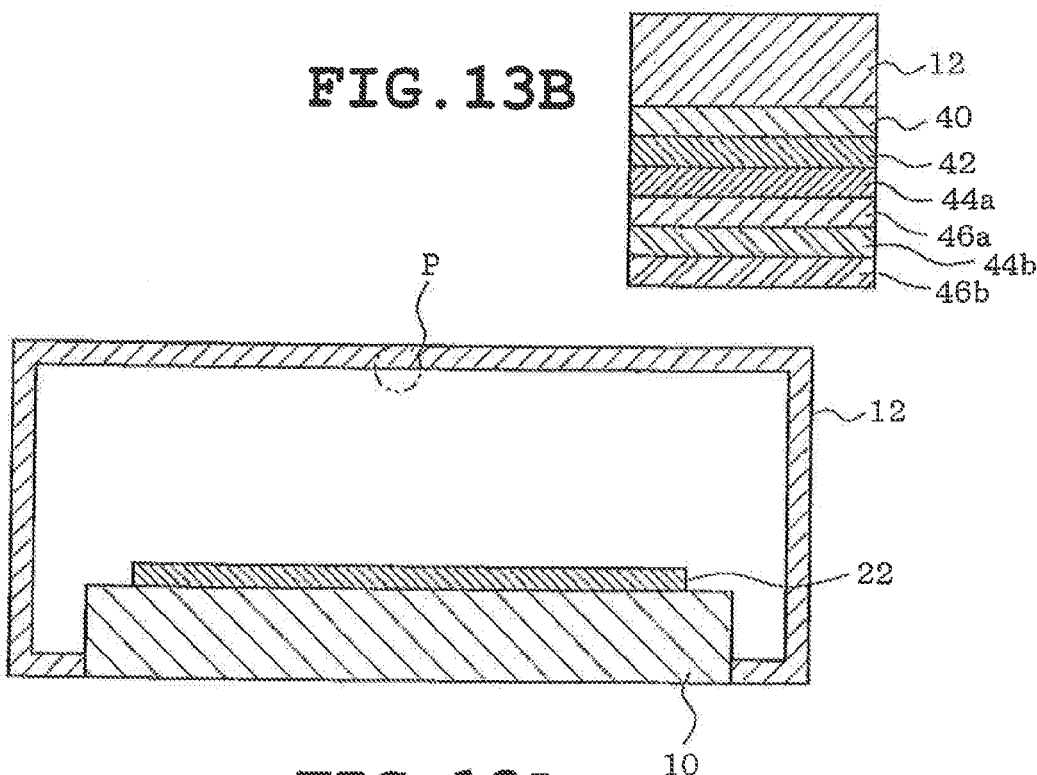
FIG.13B
FIG.13A
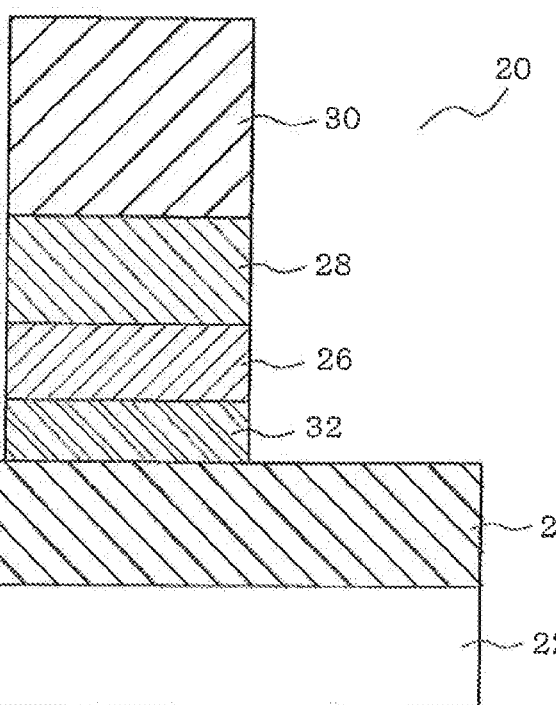
FIG.13C

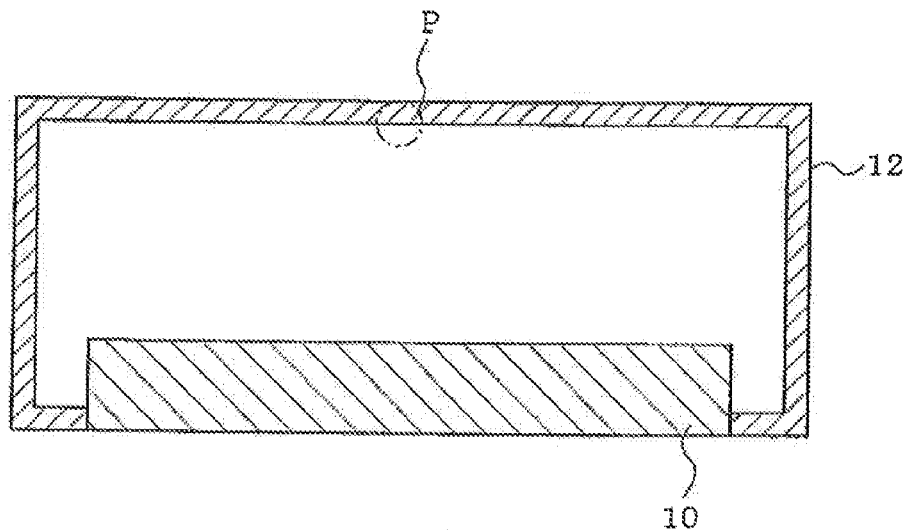
FIG.15B
FIG.15A
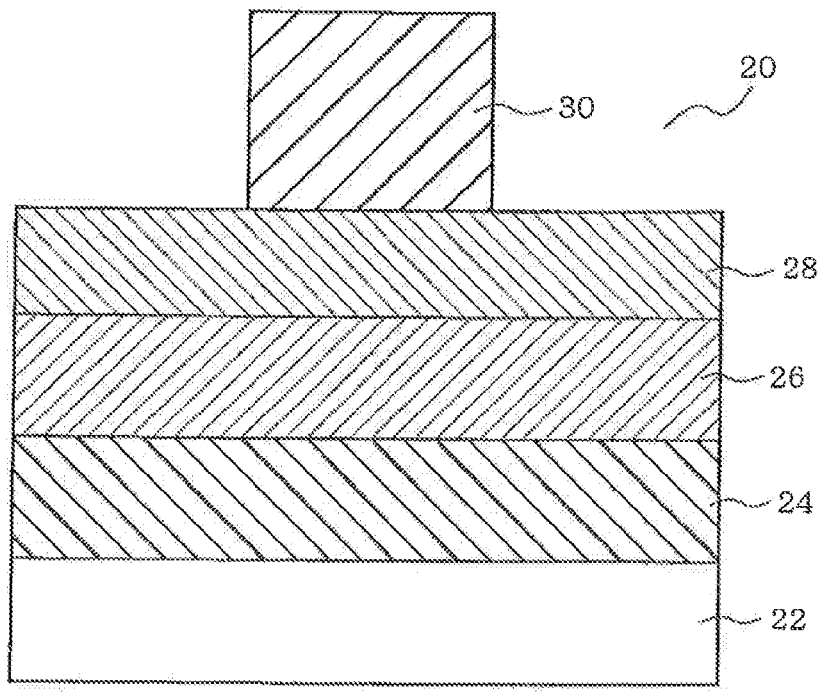
FIG.15C

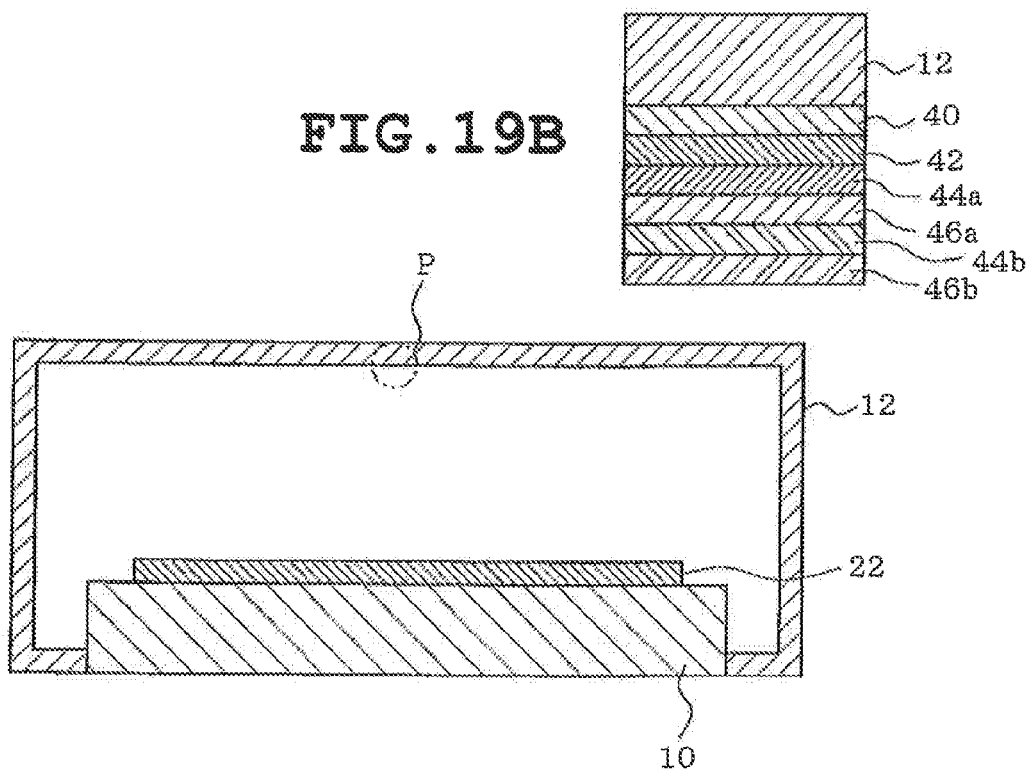
FIG.19B
FIG.19A
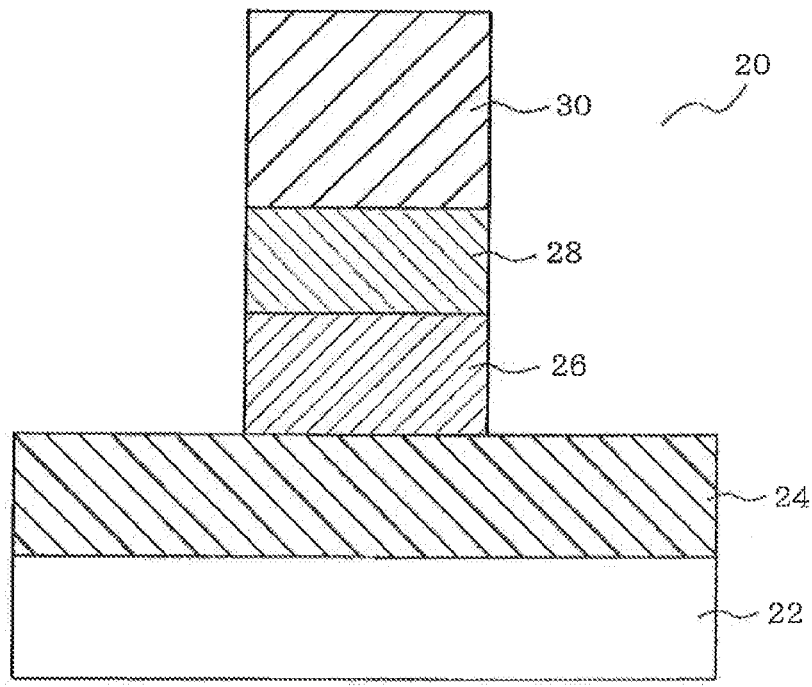
FIG.19C

METHOD OF MANUFACTURING SEMICONDUCTOR DEVICE

CROSS-REFERENCE TO RELATED APPLICATION(S)

This application is based upon and claims the benefit of priority from Japanese Patent Application No. 2013-212803, filed on, Oct. 10, 2013 the entire contents of which are incorporated herein by reference.

FIELD

Embodiments disclosed herein generally relate to a method of manufacturing a semiconductor device.

BACKGROUND

RIE (Reactive Ion Etching) is widely used in pattern formation carried out during semiconductor device manufacturing. In the RIE, it may be difficult to remove reactive products deposited along the inner wall of an etching apparatus when the boiling point of the reactive product of the etch target film and etch gas is high.

BRIEF DESCRIPTION OF THE DRAWINGS

FIG. 2A is one example of a vertical cross-sectional view illustrating the plasma etching apparatus of the first embodiment in one phase of the manufacturing process flow.

FIG. 2B is one example of an enlarged view of encircled portion P of FIG. 2A.

FIG. 2C is one example of a vertical cross-sectional view illustrating a semiconductor device of the first embodiment in one phase of the manufacturing process flow.

FIG. 13A is one example of a vertical cross-sectional view illustrating the plasma etching apparatus of the second embodiment in one phase of the manufacturing process flow.

FIG. 13B is one example of an enlarged view of encircled portion P of FIG. 13A.

FIG. 13C is one example of a vertical cross-sectional view illustrating the semiconductor device of the second embodiment in one phase of the manufacturing process flow.

FIG. 15A is one example of a vertical cross-sectional view illustrating a plasma etching apparatus of a third embodiment in one phase of the manufacturing process flow.

FIG. 15B is one example of an enlarged view of encircled portion P of FIG. 15A.

FIG. 15C is one example of a vertical cross-sectional view illustrating a semiconductor device of the third embodiment in one phase of the manufacturing process flow.

FIG. 19A is one example of a vertical cross-sectional view illustrating the plasma etching apparatus of the third embodiment in one phase of the manufacturing process flow.

FIG. 19B is one example of an enlarged view of encircled portion P of FIG. 19A.

FIG. 19C is one example of a vertical cross-sectional view illustrating the semiconductor device of the third embodiment in one phase of the manufacturing process flow.

DESCRIPTION

In one embodiment, a method of manufacturing a semiconductor device is disclosed which includes processing a semiconductor substrate using a plasma etching apparatus provided with a processing chamber. The semiconductor substrate has an uneasily-etched material formed thereabove and at least an upper layer film formed above the uneasily-etched material. The method includes etching the upper layer film after loading the semiconductor substrate into the processing chamber; forming a lift-off layer along an inner wall of the processing chamber with the semiconductor substrate loaded in the processing chamber; etching the uneasily-etched material and causing deposition of a reactive product of the uneasily-etched material along the lift-off layer; and cleaning, by removing the reactive product by removing the lift-off layer, the inner wall of the processing chamber after the semiconductor substrate is unloaded from the plasma etching apparatus.

EMBODIMENTS

First Embodiment

Embodiments are described hereinafter with reference to FIG. 1, FIGS. 2A to 6A, FIGS. 2B to 6B, FIG. 2C to 5C and FIGS. 7 and 8. The drawings are merely schematic and not drawn to scale and thus, do not reflect the actual measurements of the features such as the correlation of thickness to planar dimensions and the relative thickness of different layers. Further, directional terms such as up, down, lower, left, and right are used in a relative context with an assumption that the surface, on which circuitry is formed, of the later described semiconductor substrate faces up. Thus, the directional terms do not necessarily correspond to the directions based on gravitational acceleration.

Figure 1:
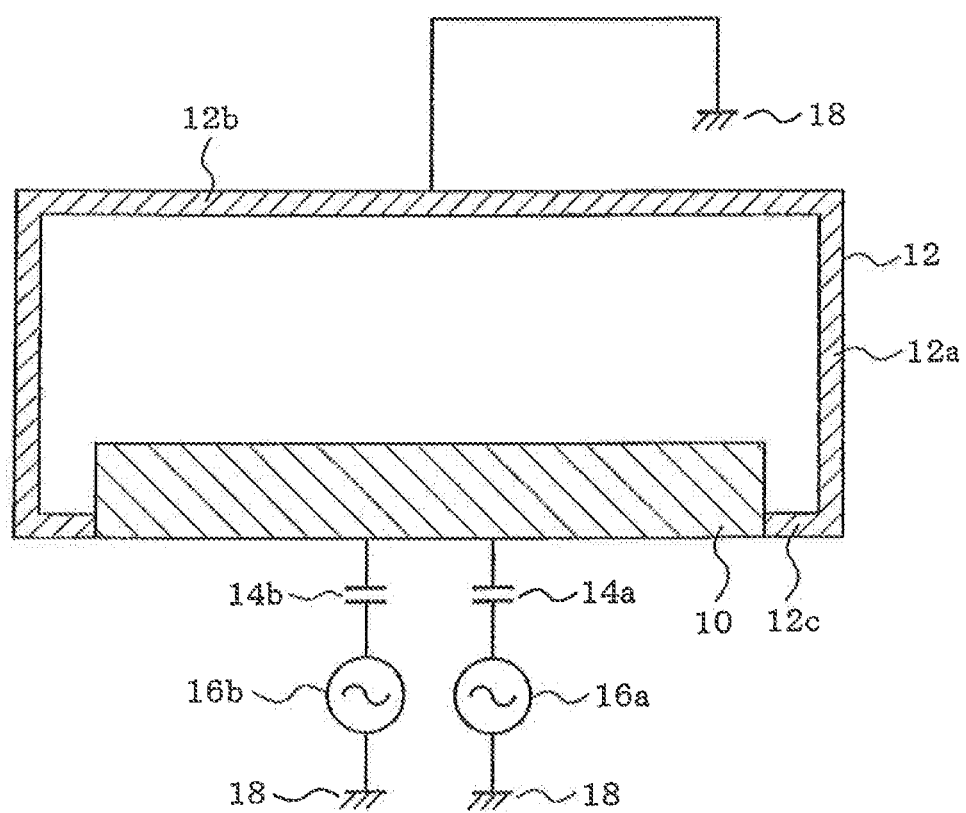
FIG. 1 is a vertical cross-sectional view schematically illustrating one example of a plasma etching apparatus used in a first embodiment.

FIG. 1 is a vertical cross-sectional view schematically illustrating one example of a CCP (Capacitively Coupled Plasma)-type plasma etching apparatus used in the first embodiment. The plasma etching apparatus includes processing chamber 12. Processing chamber 12 may be made of for example a surface-anodized aluminum. Processing chamber 12 is shaped like a cylinder for example and includes sidewall portion 12a, upper surface portion 12b, and bottom surface portion 12c. Upper surface portion 12b of processing chamber 12 is connected to earth 18. In an alternative embodiment, processing chamber 12 may have a floating potential. The interior of processing chamber 12 is sealed airtight. Upper surface portion 12b of processing chamber 12 serves as the upper electrode of the plasma etching apparatus during plasma processing.

Stage 10 is disposed inside processing chamber 12. Stage has blocking capacitor 14a and high-frequency power supply 16a series connected to it. High-frequency power supply 16a is connected to earth 18. Further, stage 10 has blocking capacitor 14b and high-frequency power supply 16b series connected to it. High-frequency power supply 16b is connected to earth 18. High-frequency power supply 16a is a high-frequency power supply for supplying bias power. High-frequency power supply 16b is a high-frequency power supply for generating plasma and supplies source power. Stage 10 serves as a lower electrode of plasma etching apparatus and is made of for example a conductive material such as aluminum or stainless steel.

Stage 10 is surrounded by an insulating member not shown. Thus, stage 10 is insulated from processing chamber 12. Stage serves as a cathode during plasma processing. Stage 10 comprises an electrostatic chuck. Semiconductor substrate 22 sticks to the electrostatic chuck by Coulomb force and is thereby held by the electrostatic chuck in the later described etch process. The above briefly describes the plasma etching apparatus used in the first embodiment.

Next, a description will be given on the manufacturing process flow of the first embodiment. FIGS. 2A to 6A, 2B to 6B, 2C to 5C are each one example of a vertical cross sectional view for describing the state of plasma etching apparatus and semiconductor device 20 being processed by it in one phase of the manufacturing process flow. FIGS. 2A to 6A are each one example of a vertical cross-sectional view for describing the state of the plasma etching apparatus in one phase of the manufacturing process flow. FIGS. 2B to 6B are each enlarged views of a portion (encircled and identified by P) of processing chamber 12 shown in FIGS. 2A to 6A and illustrate the surface of the inner wall of processing chamber 12 in detail.

Figure 8:
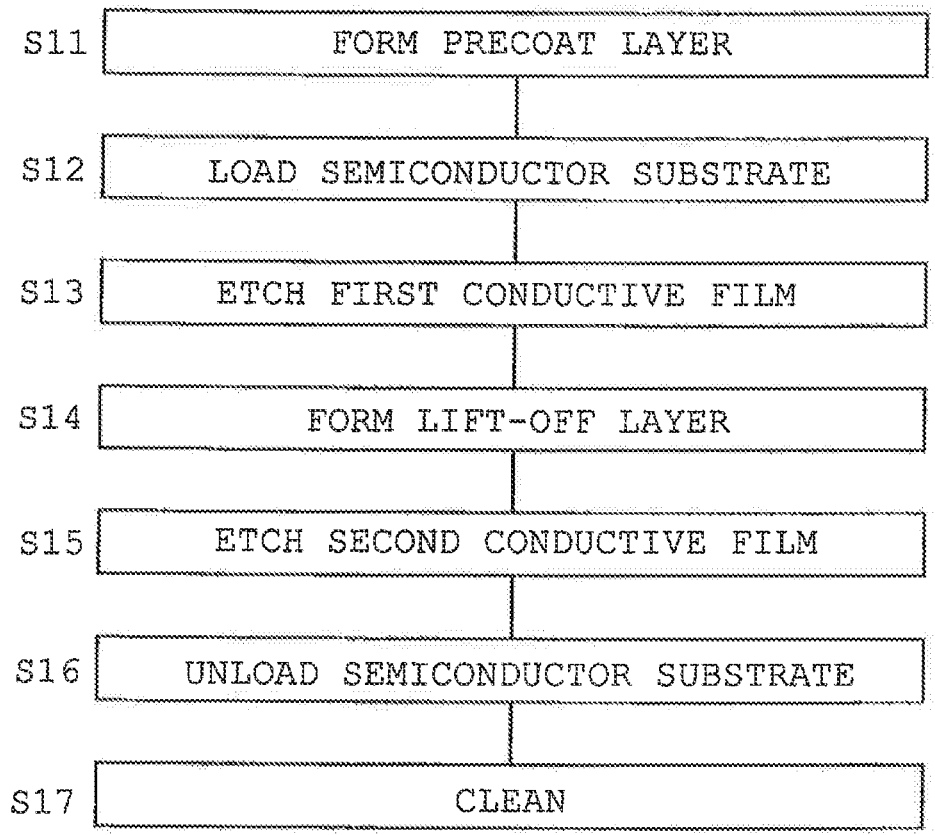
FIG. 8 is a flowchart indicating the manufacturing process flow of the first embodiment.

Blocking capacitor 14a and 14b, high-frequency power supply 16a and 16b, and earth 18 are not shown in FIGS. 2A to 6A. FIGS. 2C to 5C are each one example of a vertical cross sectional view illustrating the structure of semiconductor device 20 in one phase of the etch process of the first embodiment. FIG. 8 is a flowchart indicating the process flow of the first embodiment. The first embodiment is described based on a CCP-type plasma etching apparatus application, one example of which is illustrated in FIG. 1.

FIG. 2C is one example of a vertical cross-sectional view illustrating semiconductor device 20 immediately before being subjected to the process carried out in the first embodiment. Insulating film 24 is formed above semiconductor device 22. Above insulating film 24, second electrically-conductive film layer 26 and first electrically-conductive film layer 28 are formed and a patterned etch mask layer 30 is formed above first conductive film layer 28. First and second electrically-conductive film layers 28 and 26 are also hereinafter referred to as first and second conductive film layers 28 and 26 for short. Semiconductor substrate 22 may comprise for example a p-type silicon substrate 22 doped with boron.

Insulating film 24 may comprise a silicon oxide film formed for example by employing TEOS (Tetraethyl orthosilicate) as a source gas.

Silver (Ag) may be employed for example as second conductive film layer 26. Silver may be replaced by iron (Fe), cobalt (Co), nickel (Ni), copper (Cu), chrome (Cr), manganese (Mn), magnesium (Mg), platinum (Pt), gold (Au), Iridium (Ir), or the like. These chemical species produce reactive products with the process gas of the later described etch process that have high boiling points (meaning that vapor pressure is low and volatility is low). Compounds of halogens (fluorine, chlorine, bromine), or the like may be used for example as a process gas.

The chemical species producing reactive products having high boiling points with the above described process gases such as fluorine are hereinafter also referred to as uneasily-etched materials. For example, the boiling point of silicon fluoride ($SiF_4$) is −95.1 degrees Celsius at 1 atmosphere, whereas the boiling point of silver fluoride (AgF) is 1150 degrees Celsius at 1 atmosphere. This is an indication that volatility of reactive products produced with silver is low compared to the reactive products produced with silicon.

Reactive product of uneasily-etched material and halogen such as fluorine produced during the etch process may deposit along the inner wall of processing chamber 12 of the plasma etching apparatus. It is difficult to remove the reactive product deposited along the inner wall of processing chamber 12 by a cleaning process when the boiling point of the deposited reactive material is high. For example, the reactive product of fluorine (F) and silver (Ag) may be primarily composed of silver fluoride (AgF). Because the boiling point of silver fluoride is high, it is not easily removed by a cleaning process.

Tungsten (W) may be used for example as first conductive film layer 28 which is also referred to as an upper layer film. Tungsten may be replaced by molybdenum (Mo), titanium (Ti), or aluminum (Al). Reactive products of these chemical species and halogens such as fluorine have relatively low boiling points and relatively high volatility. The reactive products may deposit along the inner wall of processing chamber 12 but they can be removed by a cleaning process.

A silicon oxide film may be used as etch mask layer 30. The silicon oxide film may be formed for example by plasma CVD (Chemical Vapor Deposition) using silane ($SiH_4$) as a source gas. The silicon oxide film may be patterned into etch mask layer 30 by lithography and RIE. First conductive film layer 28 and second conductive film layer 26 are etched using etch mask layer 30 as a mask in the later described etch process of the first embodiment.

Next, the process flow of the first embodiment will be described in a step by step manner. First, as shown in FIGS. 2A and 2B, precoat layer 40 is formed in processing chamber 12 before semiconductor substrate 22 is loaded into the plasma etching apparatus (FIG. 8: S11). Precoat layer 40 may be formed by using a process gas including tetrachlorosilane ($SiCl_4$) and oxygen ($O_2$). High-frequency source power having a frequency of 100 MHz and voltage level of 500 W or less for example may be applied to high-frequency-power supply 16b. Thus, precoat layer 40 may be formed by generating plasma in processing chamber 12 and causing the reaction of the process gas. For example, precoat layer 40 may be a reactive product primarily composed of $SiClOx$. Precoat layer 40 may be removed by the later described cleaning process. Semiconductor substrate 22 to be etched has not been loaded into the plasma etching apparatus and thus, semiconductor substrate 22 is not placed on stage 10.

When potential difference between stage 10 and plasma is represented as Vc and the potential difference between the inner wall of processing chamber 12 and plasma is represented as Va, the relation of Vc≈Va (meaning that Vc and Va are substantially equal) holds when high-frequency source power is applied under the above described conditions. Stage 10 may also be referred to as cathode or lower electrode and processing chamber 12 may also be referred to as an upper electrode. High-frequency power supply 16b, used for generating plasma, is connected to stage 10. Thus, contribution of high-frequency source power to Va is small. Further, the self bias in stage 10 side is small under the above described conditions. Precoat layer 40 is formed above the surface of stage 10 and along the surface of the inner wall of processing chamber 12. It is difficult for precoat layer 40 to form above stage 10 when Vc>Va. Further, the absence of semiconductor substrate 22 on stage 10 may cause stage 10 to be attacked by ions generated by plasma and accelerated by self bias and thereby damaged by etching or sputtering. Such damaging of stage 10 can be prevented by establishing the relation of Vc≈Va as in the first embodiment. Vc and Va may be measured by a probe method in which a microprobe is placed in the plasma.

Next, semiconductor substrate 22, provided with etch mask layer 30 processed by lithography and RIE, is loaded into processing chamber 12 (FIG. 8: S12). Semiconductor substrate 22 may also be referred to and represented more generally as semiconductor device 20 as shown in FIG. 2C.

Figure 3B:
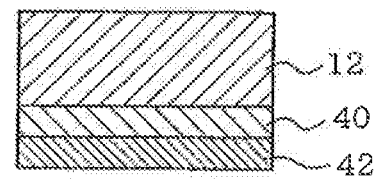
FIG. 3B is one example of an enlarged view of encircled portion P of FIG. 3A.
Figure 3A:
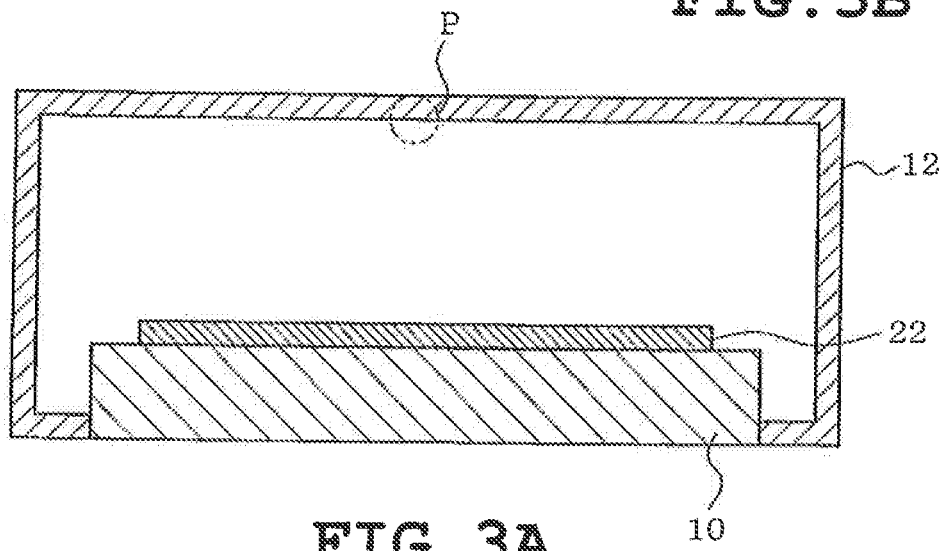
FIG. 3A is one example of a vertical cross-sectional view illustrating the plasma etching apparatus of the first embodiment in one phase of the manufacturing process flow.
Figure 3C:
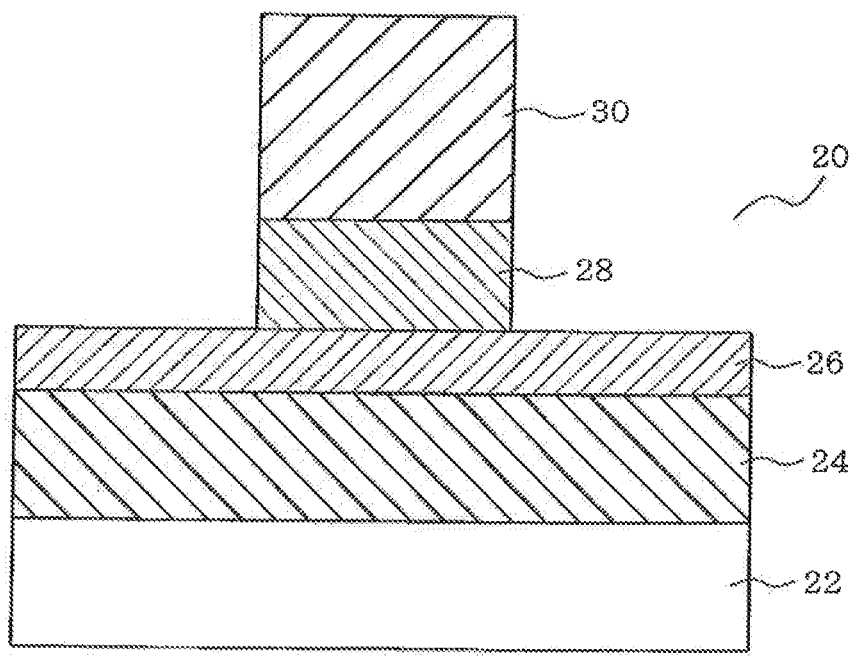
FIG. 3C is one example of a vertical cross-sectional view illustrating the semiconductor device of the first embodiment in one phase of the manufacturing process flow.

As shown in FIGS. 3A and 3C, first conductive film layer 28 serving as an upper layer film is etched using etch mask layer as a mask (FIG. 8: S13). The etching is carried out by anisotropic RIE using a gas including $NF_3$ and $Cl_2$ for example as a process gas. When first conductive film layer 28 comprises tungsten for example, reactive product 42 of tungsten and the process gas is formed when first conductive film layer 28 is etched. For example, reactive product 42 may be primarily composed of tungsten fluoride (WFx) and tungsten chloride (WClx).

As shown in FIG. 3B, reactive product 42 deposits along the inner wall of processing chamber 12. As a result, a stack of precoat layer 40 and reactive product 42 deposit along the inner wall of processing chamber 12. In the description given hereinunder, among the portions of the layers of deposits along the inner wall of processing chamber 12, the portion relatively closer to processing chamber 12 may be referred to as the lower layer side and the portion relatively closer to the exposed surface of the layers of deposits may be referred to as the upper layer side.

As shown in 4C, lift-off layer 44 is formed (FIG. 8: S14). A gas mixture including rare gas and a gas containing carbon/halogenated silicon may be used in forming lift-off layer 44. The gas containing carbon may comprise for example methane ($CH_4$), carbon monoxide (CO), or the like. The gas containing halogenated silicon may comprise for example tetrachlorosilane ($SiCl_4$) or the like. The rare gas may comprise for example helium (He), argon (Ar), neon (Ne), krypton (Kr), xenon (Xe), or the like.

High-frequency source power having a frequency of 100 MHz and voltage level ranging from 1000 to 2000 W may be applied to high-frequency power supply 16b in order to generate plasma in processing chamber 12. As described above, a power supply voltage having a frequency of 100 MHz is used and not 13.56 MHz. Further, the bias power of high-frequency-power supply 16a is set to 0 W, meaning that no power is supplied. Thus, lift-off layer 44 may be selectively deposited along the inner wall of processing chamber 12 exclusive of stage 10 serving as the cathode. Lift-off layer 44 is a film primarily composed of carbon which can be removed by the later described cleaning process.

Figure 4B:
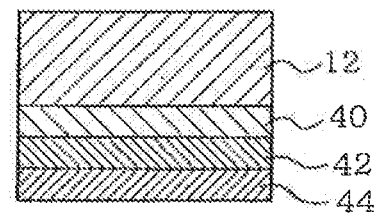
FIG. 4B is one example of an enlarged view of encircled portion P of FIG. 4A.
Figure 4A:
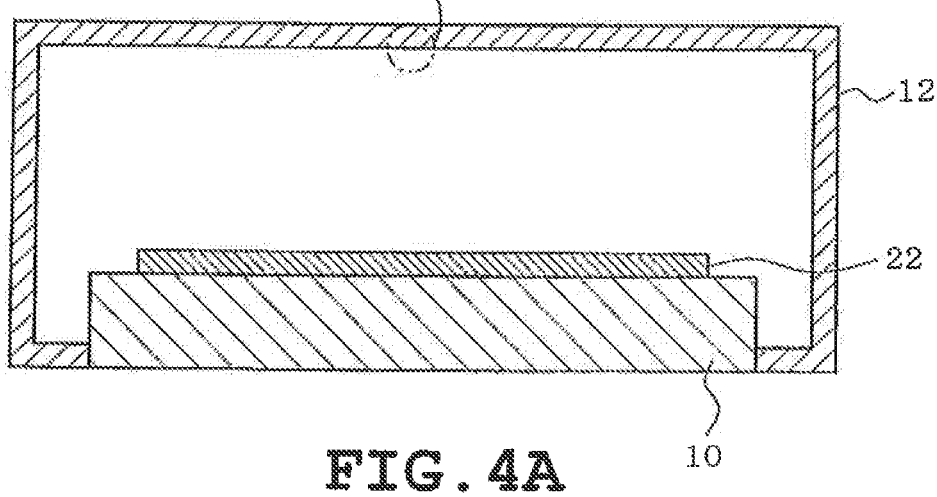
FIG. 4A is one example of a vertical cross-sectional view illustrating the plasma etching apparatus of the first embodiment in one phase of the manufacturing process flow.
Figure 4C:
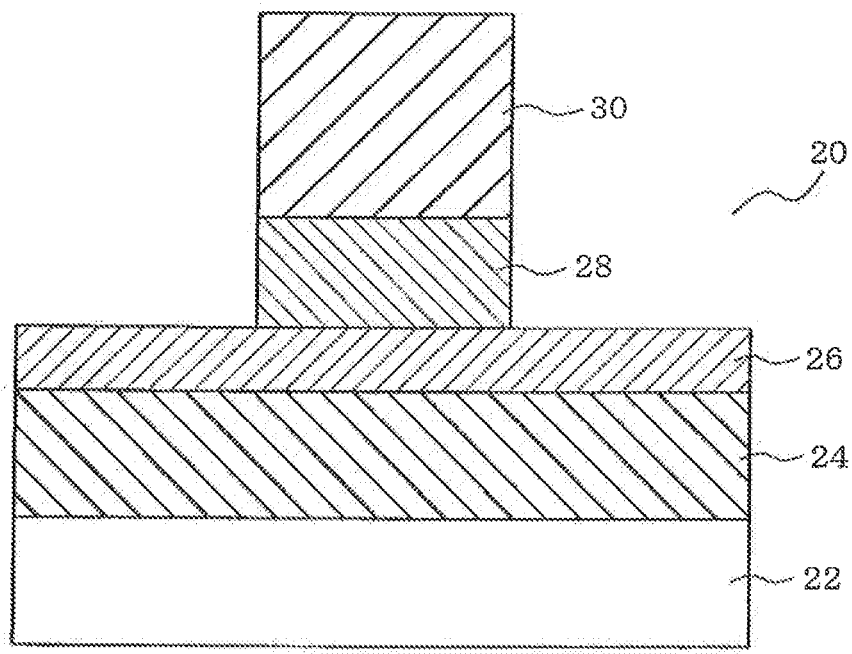
FIG. 4C is one example of a vertical cross-sectional view illustrating the semiconductor device of the first embodiment in one phase of the manufacturing process flow.

In the first embodiment, it is possible to establish the relation of Vc>Va for potential difference (Vc) between stage 10, or semiconductor substrate 22 placed on it, and plasma and potential difference (Va) between plasma and the inner wall of processing chamber 12 exclusive of stage 10 by applying a high-frequency power supply of 100 MHz. Thus, lift-off layer 44 is selectively formed along the inner wall of processing chamber 12 and not along stage 10 (semiconductor substrate 22). As shown in FIG. 4B, precoat layer 40, reactive product 42, and lift-off layer 44 are stacked along the inner wall of processing chamber 12. As shown in FIG. 4C, lift-off layer 44 is not formed above semiconductor substrate 22.

Figure 7:
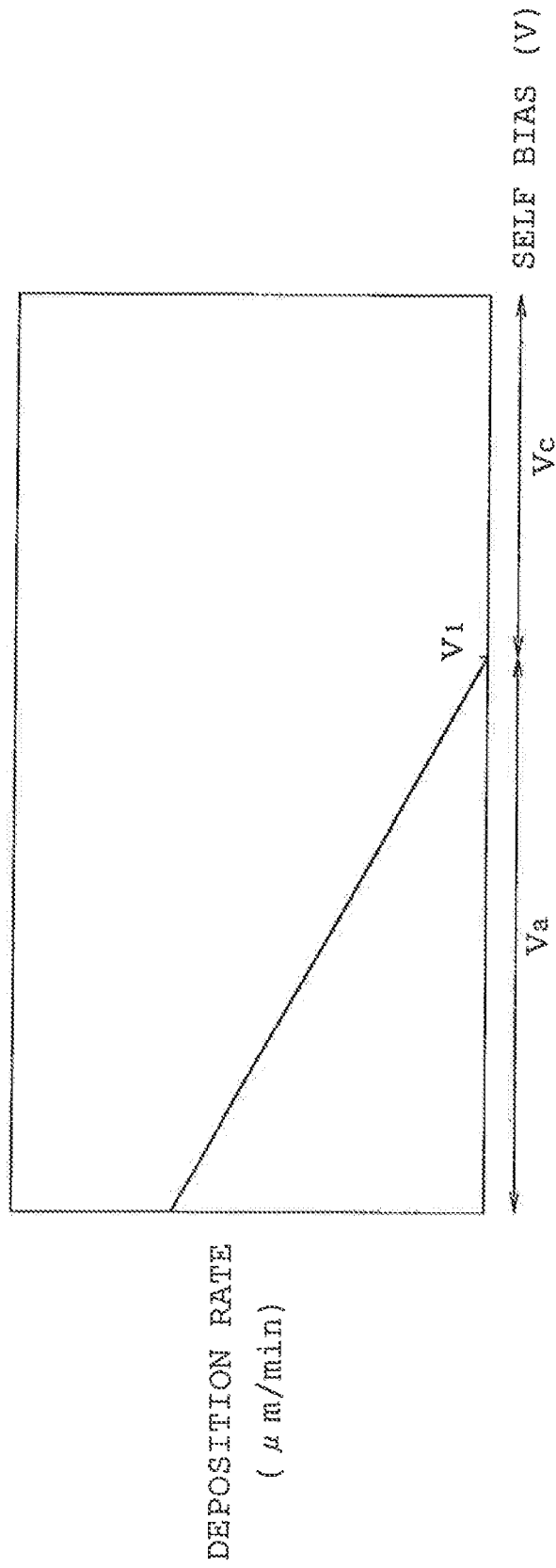
FIG. 7 is a graph indicating the relation between the deposition rate of a lift-off layer and self bias.

FIG. 7 is a graph indicating the relation between the deposition rate of lift-off layer 44 and self bias. The lateral axis of the graph represents the self bias and the vertical axis represents the deposition rate of lift-off layer 44. The deposition rate is reduced as the self bias increases from 0V. The deposition rate is reduced to zero when self bias becomes equal to or greater than V1. Thus, the relation of Vc>Va described above can be established by specifying Va and Vc to range as 0<Va<V1 and Vc>V1. Lift-off layer 44 can be formed selectively along the inner wall of processing chamber 12 by the above described setting.

Figure 5B:
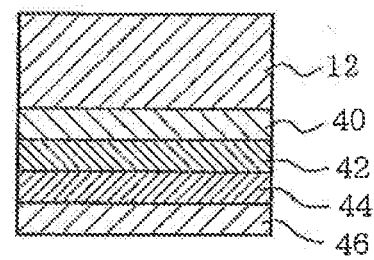
FIG. 5B is one example of an enlarged view of encircled portion P of FIG. 5A.
Figure 5A:
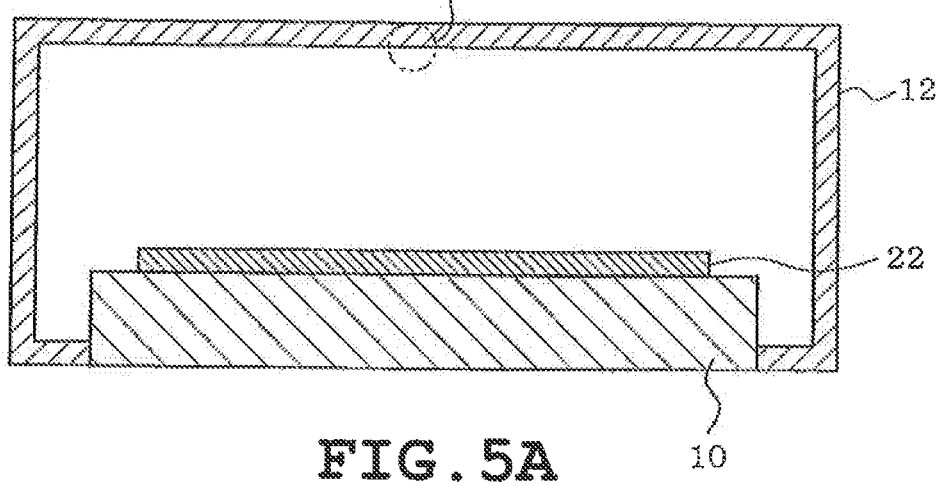
FIG. 5A is one example of a vertical cross-sectional view illustrating the plasma etching apparatus of the first embodiment in one phase of the manufacturing process flow.
Figure 5C:
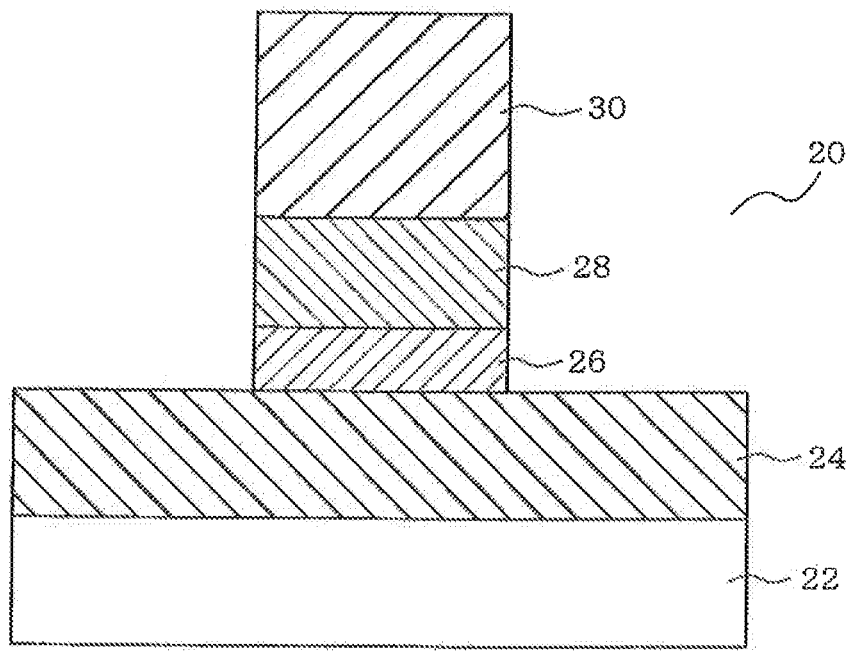
FIG. 5C is one example of a vertical cross-sectional view illustrating the semiconductor device of the first embodiment in one phase of the manufacturing process flow.

Referring now to FIG. 5C, second conductive film layer 26 is etched (FIG. 8: S15). The etching is carried out for example by anisotropic RIE using a gas including $Cl_2$ (chlorine) for example as etch gas. During the etch process, second conductive film layer 26 reacts with the etch gas (including chlorine) to produce reactive product 46 of silver and chlorine. For example, reactive product 46 may be primarily composed of silver chloride (AgCl). Reactive product 46 is transported to the vicinity of processing chamber 12 and deposited along the inner wall of processing chamber 12.
As a result, precoat layer 40, reactive product 42, lift-off layer 44, and reactive product 46 are deposited along the inner wall of processing chamber 12 so as to be stacked toward the upper layer side from the lower layer side. In the first embodiment, second conductive film layer 26 includes silver (Ag) for example as an uneasily-etched material. Thus, reactive product 46 of second conductive film layer 26 and chlorine has a high boiling point and is difficult to remove in the later described cleaning step.

Figure 6B:
FIG. 6B is one example of an enlarged view of encircled portion P of FIG. 6A.
Figure 6A:
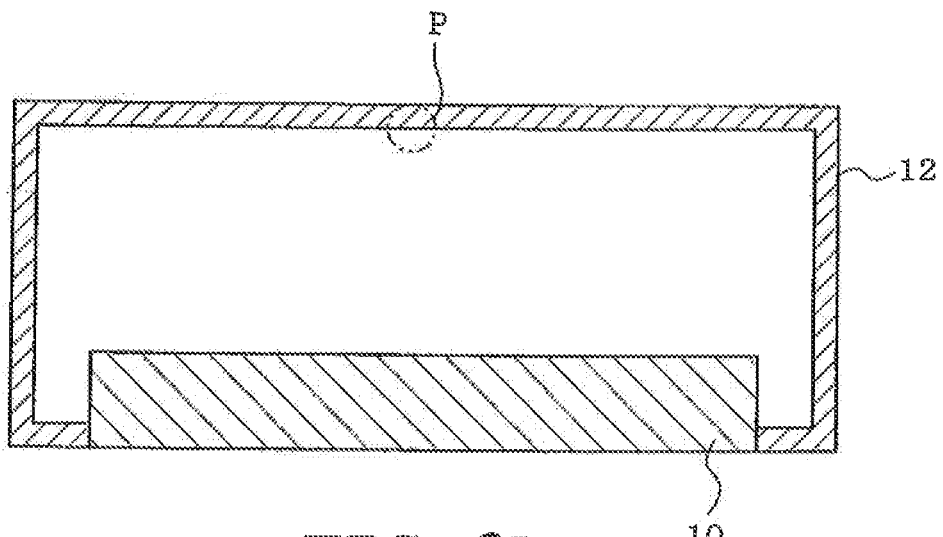
FIG. 6A is one example of a vertical cross-sectional view illustrating the plasma etching apparatus of the first embodiment in one phase of the manufacturing process flow.

Referring now to FIG. 6A, semiconductor substrate 22 is unloaded from the plasma etching apparatus (FIG. 8: S16). Then, a cleaning process is carried out with respect to the deposits deposited along the inner wall of processing chamber 12 (FIG. 8: S17). The cleaning process is carried out by applying RF (Radio Frequency) power to high-frequency power supply 16b at a pressure of 50 mTorr, frequency of 100 MHz, and voltage level of 1500 W for example. A process gas including fluoride or oxygen ($O_2$) may be used. A mixed gas of $NF_3/O_2$ is one example of such process gas.

In the cleaning process, precoat layer 40 and lift-off layer 44 which are formed along the inner wall of processing chamber 12 can be easily removed. In contrast, reactive product 46 is difficult to remove by the cleaning process as described above.
Thus, it is desirable to remove reactive product 46 deposited along the inner wall of processing chamber 12 by a lift-off effect in which reactive product 46 is removed when the lower layer side is removed. However, when a consecutive stack of reactive products 42 and 46 is deposited along precoat layer 40, it may be difficult to remove precoat layer 40 in the cleaning process.

In the first embodiment, on the other hand, lift-off layer 44 (carbon layer) which is easily removed by the cleaning process is formed in the lower layer side of reactive product 46. Thus, reactive product 46 is removed by the lift-off effect by removing lift-off layer 44 immediately below reactive product 46 in the above described cleaning process.

The boiling point of reactive product 42 is lower than the boiling point of reactive product 46 and is easily removed by the cleaning process. Precoat layer 40 disposed in the lower layer side of reactive product 42 is even more easily removable than reactive product 42. Thus, reactive product 42 can be removed by the lift-off effect when precoat layer 40 in the lower layer side of reactive product 42 is removed. As described above, reactive product 46 can be easily removed by forming in advance lift-off layer 44 removable by the cleaning process in the lower layer side of reactive product 46 which is difficult to remove by the cleaning process. Thus, even when a reactive product having a high boiling point is deposited along the inner wall of the etching apparatus, such reactive product can be removed with ease. Further, by forming in advance precoat layer 40 removable by the cleaning process in the lower layer side of reactive product 42, reactive product 42 and consequently reactive product 46 can be easily removed by the lift-off effect. In summary, reactive product 46 deposited along the inner wall of processing chamber 12 can be removed more effectively.

Second Embodiment

A second embodiment is described hereinafter with reference to FIGS. 9A to 13A, FIGS. 9B to 13B, FIGS. 9C to 13C and FIG. 14. Elements that are identical to those of the first embodiment are identified with identical reference symbols and process steps that are identical to the first embodiment are described with reference to the drawings referred to in the first embodiment. FIGS. 9A to 13A, are each one example of a vertical cross sectional view for describing the state of plasma etching apparatus. FIGS. 9B to 13B are each enlarged views of an encircled portion P of processing chamber 12 and illustrate the surface of the inner wall of processing chamber 12 in detail.

Figure 14:
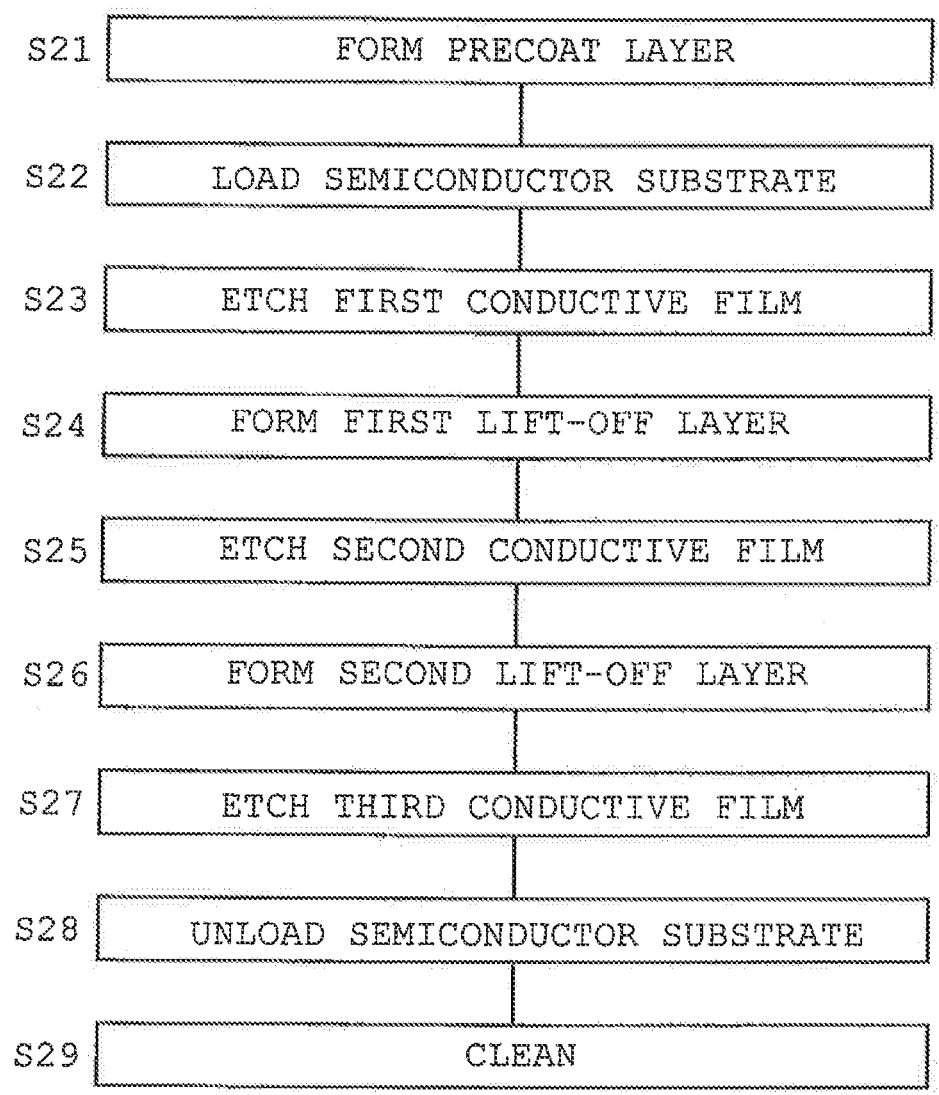
FIG. 14 is a flowchart indicating the manufacturing process flow of the second embodiment.

Blocking capacitors 14a and 14b, high-frequency power supplies 16a and 16b, and earth 18 are not shown in FIGS. 9A to 13A. FIG. 9C to 13C are each one example of a vertical cross sectional view illustrating the structure of semiconductor device 20 in one phase of the etch process of the second embodiment. FIG. 14 is a flowchart indicating the process flow of the second embodiment. The second embodiment is also described based on a CCP-type plasma etching apparatus application, one example of which is illustrated in FIG. 1.

Figure 9B:
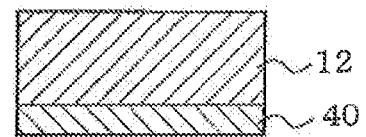
FIG. 9B is one example of an enlarged view of encircled portion P of FIG. 9A.
Figure 9A:
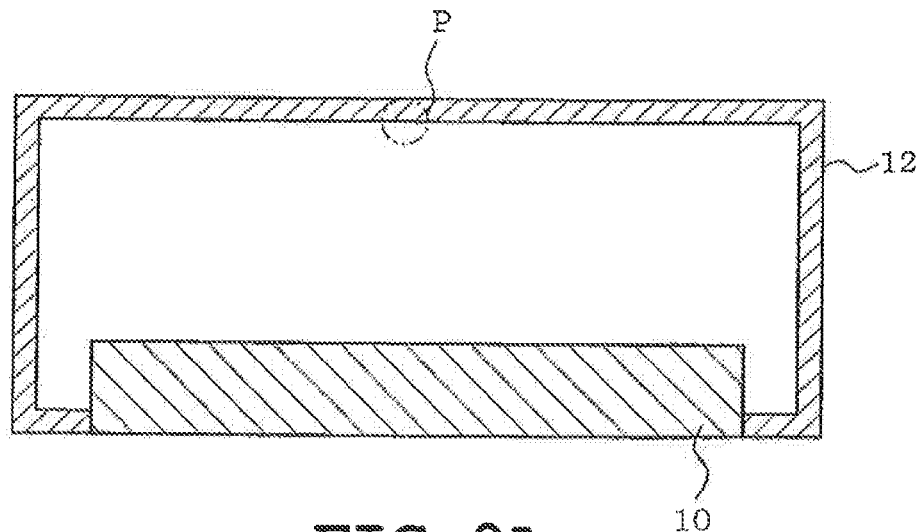
FIG. 9A is one example of a vertical cross-sectional view illustrating a plasma etching apparatus of a second embodiment in one phase of the manufacturing process flow.
Figure 9C:
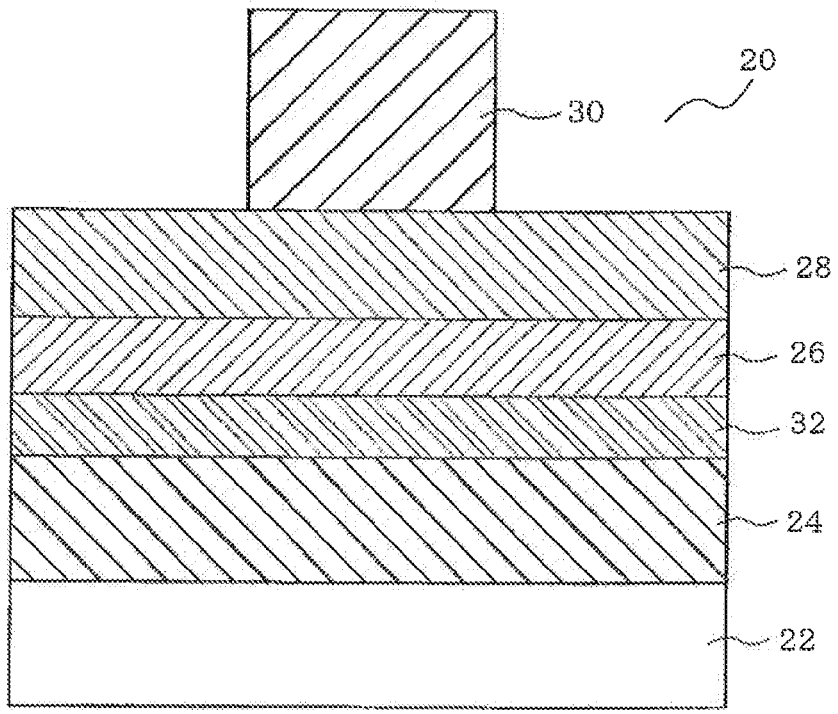
FIG. 9C is one example of a vertical cross-sectional view illustrating a semiconductor device of the second embodiment in one phase of the manufacturing process flow.

FIG. 9C illustrates semiconductor device 20 immediately before being subjected to the process carried out in the second embodiment. The second embodiment differs from the first embodiment in that the uneasily etched layer is a double layer. This means that third conductive film layer 32, serving as a first uneasily etched layer in the lower portion, is formed above insulating film 24 and second conductive film layer 26, serving as a second uneasily etched layer in the upper portion, is stacked above third conductive film layer 32. First conductive film layer 28 is formed above second conductive film layer 26. Other portions are identical to the structures illustrated in FIG. 2C of the first embodiment.

Iron (Fe) may be employed for example as third conductive film layer 32. Third conductive film layer 32 is an uneasily-etched material like second conductive film layer 26 and may be replaced by silver (Ag), cobalt (Co), nickel (Ni), copper (Cu), chrome (Cr), manganese (Mn), magnesium (Mg), platinum (Pt), gold (Au), Iridium (Ir), or the like. In other words, third conductive film layer 32 produces reactive products having high boiling points with the process gas used in the etch process. Silver (Ag) may be employed for example as second conductive film layer 26. Tungsten (W) may be employed for example as first conductive film layer 28.

Etch mask layer 30 is obtained by forming a silicon oxide film and patterning the silicon oxide film by lithography and RIE. As later described, the etch process of the second embodiment etches first conductive film layer 28, second conductive film layer 26, and third conductive film layer 32 using etch mask layer as a mask.

Next, the process flow of the second embodiment will be described in a step by step manner. First, as shown in FIG. 9B, precoat layer 40 is formed in processing chamber 12 before semiconductor substrate 22 is loaded into the plasma etching apparatus (FIG. 14: S21). Precoat layer 40 may be formed under the conditions applied in the first embodiment.

Figure 10B:
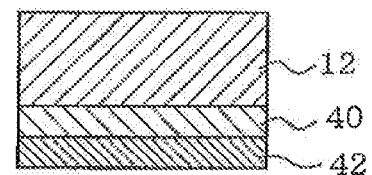
FIG. 10B is one example of an enlarged view of encircled portion P of FIG. 10A.
Figure 10A:
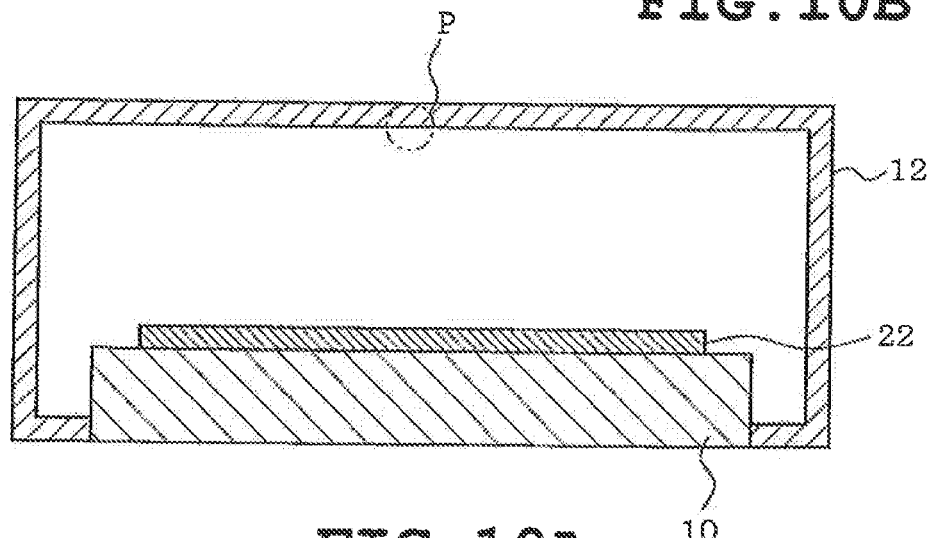
FIG. 10A is one example of a vertical cross-sectional view illustrating the plasma etching apparatus of the second embodiment in one phase of the manufacturing process flow.
Figure 10C:
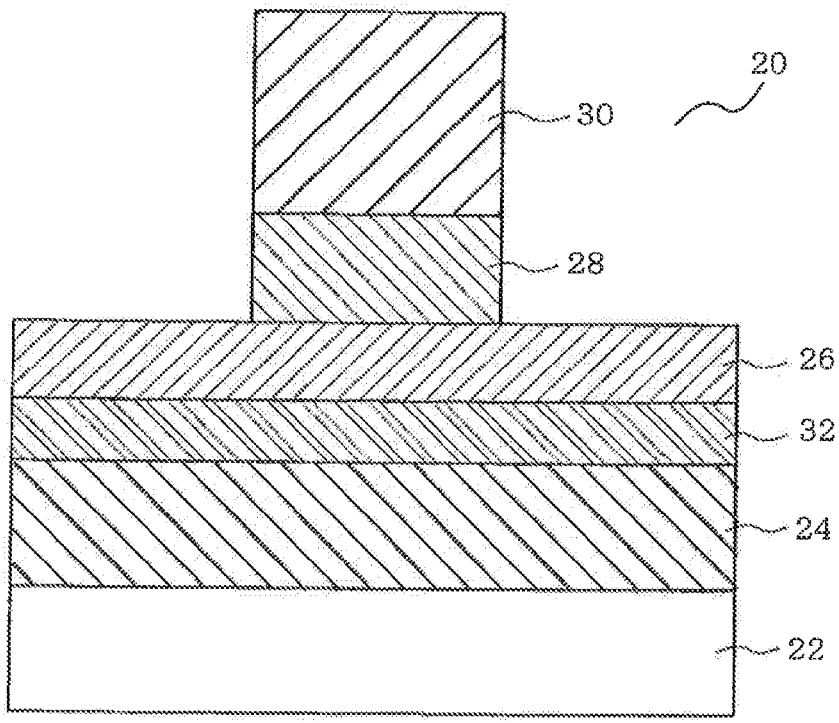
FIG. 10C is one example of a vertical cross-sectional view illustrating the semiconductor device of the second embodiment in one phase of the manufacturing process flow.

Next, semiconductor substrate 22 illustrated in FIG. 9C is loaded into processing chamber 12 (FIG. 14: S22). Then, as shown in FIG. 10C, first conductive film layer 28 is etched using etch mask layer 30 as a mask (FIG. 14: S23). The etching of first conductive film layer 28 is carried out under the conditions employed in etching first conductive film layer 28 in the first embodiment. As a result, a stack of precoat layer 40 and reactive product 42, produced by etching first conductive film layer 28, is formed along the inner wall of processing chamber 12.

Figure 11B:
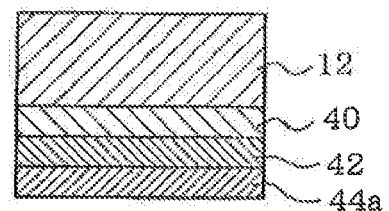
FIG. 11B is one example of an enlarged view of encircled portion P of FIG. 11A.
Figure 11A:
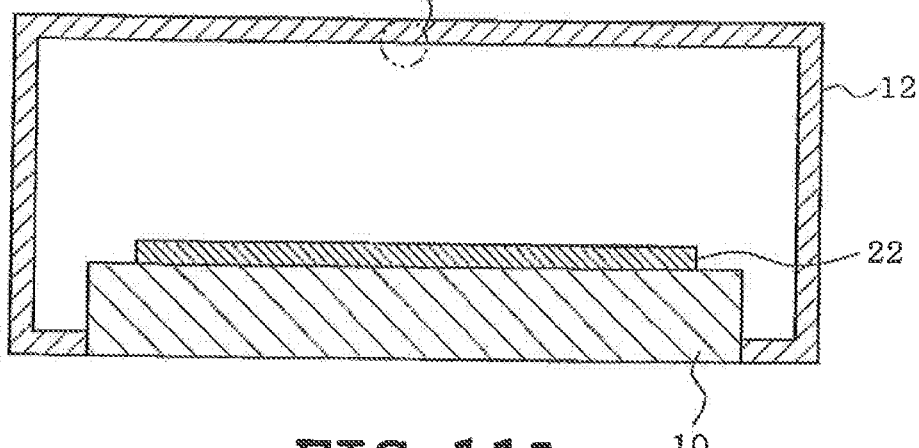
FIG. 11A is one example of a vertical cross-sectional view illustrating the plasma etching apparatus of the second embodiment in one phase of the manufacturing process flow.
Figure 11C:
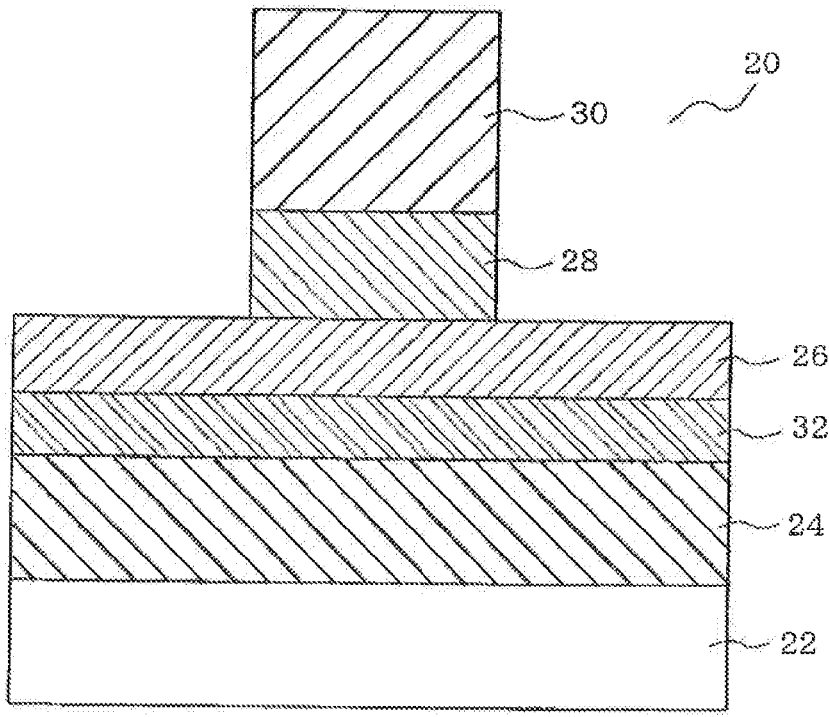
FIG. 11C is one example of a vertical cross-sectional view illustrating the semiconductor device of the second embodiment in one phase of the manufacturing process flow.

Referring now to FIG. 11B, first lift-off layer 44a is formed along reactive product 42 (FIG. 14: S24). First lift-off layer 44a may be formed under the conditions applied in forming lift-off layer 44 in the first embodiment. As a result, first lift-off layer 44a can be formed selectively along the inner wall of processing chamber 12. First lift-off layer 44a is a film primarily composed of carbon which can be removed by the later described cleaning process.

Figure 12B:
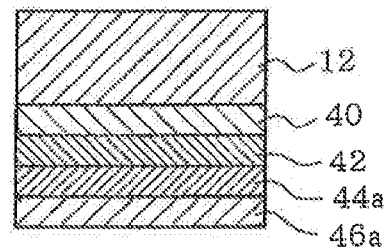
FIG. 12B is one example of an enlarged view of encircled portion P of FIG. 12A.
Figure 12A:
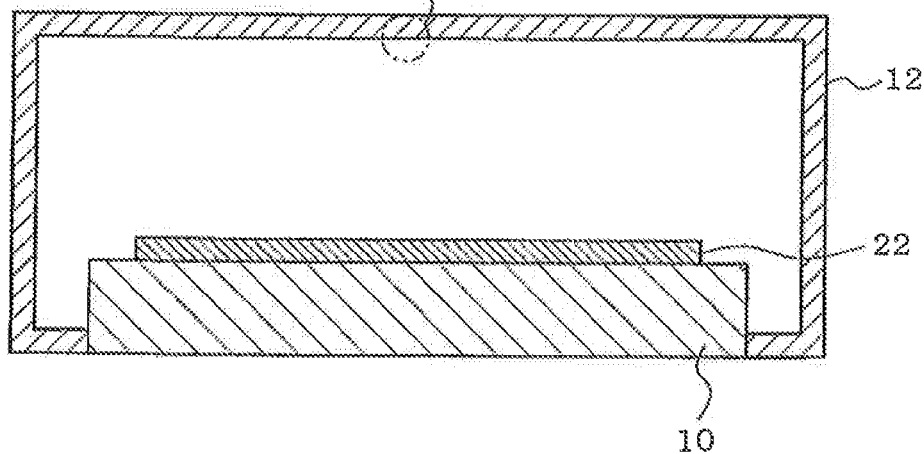
FIG. 12A is one example of a vertical cross-sectional view illustrating the plasma etching apparatus of the second embodiment in one phase of the manufacturing process flow.
Figure 12C:
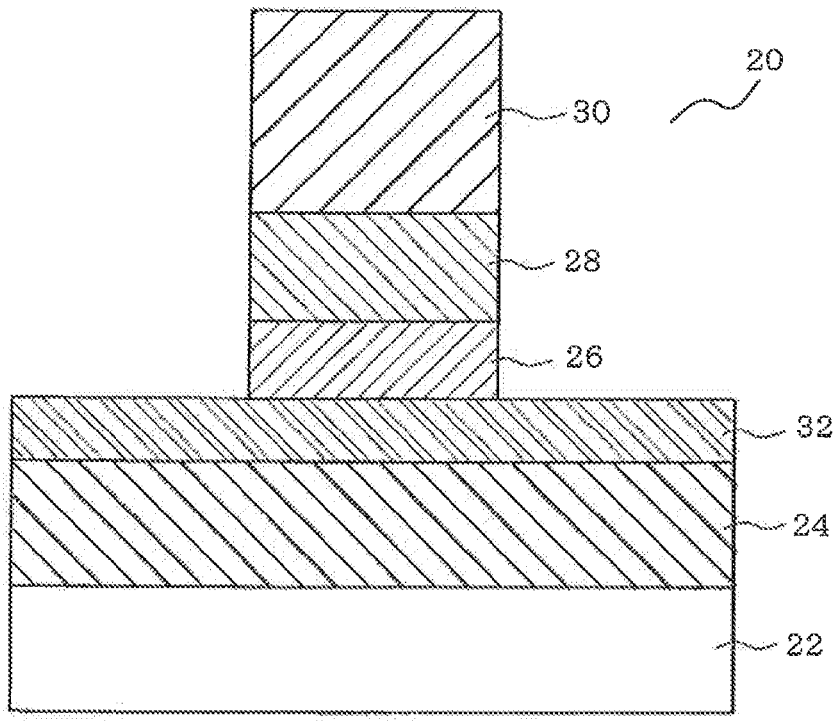
FIG. 12C is one example of a vertical cross-sectional view illustrating the semiconductor device of the second embodiment in one phase of the manufacturing process flow.

Referring now to FIG. 12C, second conductive film layer 26 is etched (FIG. 14: S25). Second conductive film layer 26 is etched under the conditions applied in etching second conductive film layer 26 in the first embodiment. During the etch process, second conductive film layer 26 reacts with the etch gas (including chlorine) to produce first reactive product 46a of silver and chlorine. First Reactive product 46a is transported to the vicinity of processing chamber 12 and deposited along the inner wall of processing chamber 12. As a result, precoat layer 40, reactive product 42, first lift-off layer 44a, and first reactive product 46a are deposited along the inner wall of processing chamber 12 so as to be stacked toward the upper layer side from the lower layer side. First reactive product 46a has a high boiling point and is difficult to remove in the cleaning step.

Referring now to FIG. 13C, second lift-off layer 44b is formed (FIG. 14: S26). Second lift-off layer 44b may be formed under the conditions applied in forming first lift-off layer 44a. As a result, second lift-off layer 44b can be formed selectively along the inner wall of processing chamber 12. Then, third conductive film layer 32 is etched (FIG. 14: S27). In the second embodiment, iron may be used for example as third conductive film layer 32 as described earlier.

Third conductive film layer 32 is etched using an etch gas including chlorine ($Cl_2$) for example. During the etch process, third conductive film layer 32 reacts with the etch gas to produce second reactive product 46b of iron and chlorine. Second reactive product 46b is transported to the vicinity of processing chamber 12 and deposited along the inner wall of processing chamber 12.

As a result, precoat layer 40, reactive product 42, first lift-off layer 44a, first reactive product 46a, second lift-off layer 44b, and second reactive product 46b are deposited along the inner wall of processing chamber 12 so as to be stacked toward the upper layer side from the lower layer side as shown in FIG. 13B. First reactive product 46a and second reactive product 46b have high boiling points and are difficult to remove in the cleaning step carried out later in the process flow.

Referring now to FIG. 6A, semiconductor substrate 22 is unloaded from the plasma etching apparatus (FIG. 14: S28). Thereafter, a cleaning process is carried out (FIG. 14: S29). The cleaning process is carried out under the conditions applied in the cleaning process of the first embodiment. In the cleaning process, second lift-off layer 44b, first lift-off layer 44a, and precoat layer 40 can be easily removed. Thus, first reactive product 46a and second reactive product 46b which are difficult to remove in the cleaning process can be easily removed by the lift-off effect when the first lift-off layer 44a and second lift-off layer 44b are removed.

As was the case in the first embodiment, reactive product 42, first lift-off layer 44a, and second lift-off layer 44b can be easily removed by the lift-off effect when precoat layer 40 in the lower layer side is removed. In the second embodiment, first lift-off layer 44a and second lift-off layer 44b which are easily removed by the cleaning process are formed in the lower layer side of first reactive product 46a and second reactive product 46b, respectively. Thus, first reactive product 46a and second reactive product 46b which are difficult to remove by the cleaning process can be easily removed.

Further, by forming precoat layer 40 easily removed by the cleaning process in the lower layer side of reactive product 42, reactive product 42 and consequently first reactive product 46a and second reactive product 46b disposed in the upper layer side of reactive product 42 can be easily removed by the lift-off effect. In summary, reactive products of uneasily-etched materials deposited along the inner wall of processing chamber 12 can be removed more effectively.

Third Embodiment

A third embodiment is described hereinafter with reference to FIGS. 15A to 19A, FIGS. 15B to 19B, FIGS. 15C to 19C, and FIG. 20. Elements that are identical to those of the second embodiment are identified with identical reference symbols and process steps that are identical to the first and the second embodiment are described with reference to the drawings referred to in the first and the second embodiment. FIGS. 15A to 19A, are each one example of a vertical cross sectional view for describing the state of plasma etching apparatus. FIGS. 15B to 19B are each enlarged views of an encircled portion P of processing chamber 12 and illustrate the surface of the inner wall of processing chamber 12 in detail.

Figure 20:
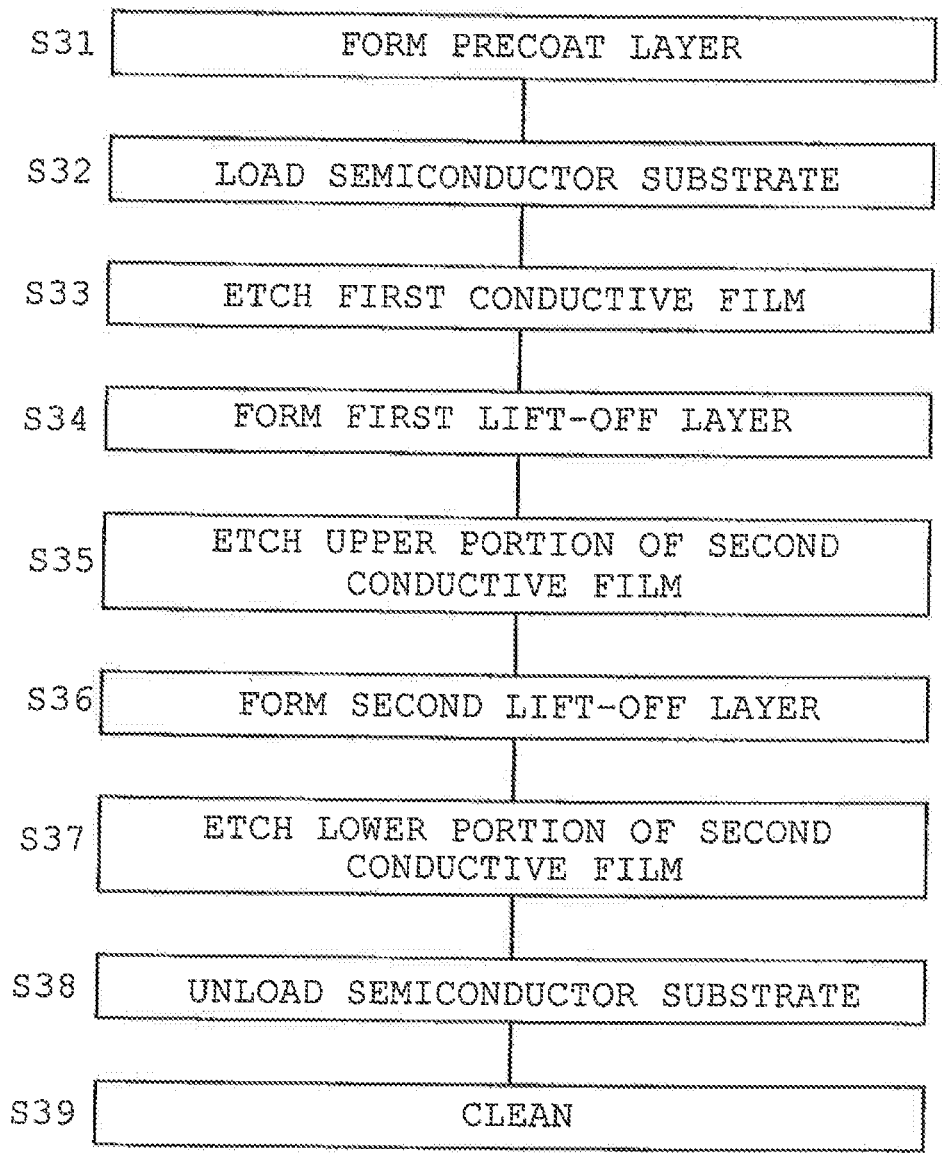
FIG. 20 is a flowchart indicating the manufacturing process flow of the third embodiment.

Blocking capacitors 14a and 14b, high-frequency power supplies 16a and 16b, and earth 18 are not shown in FIGS. 15A to 19A. FIGS. 15C to 19C are each one example of a vertical cross sectional view illustrating the structure of semiconductor device 20 in one phase of the etch process of the third embodiment. FIG. 20 is a flowchart indicating the process flow of the third embodiment. The third embodiment is also described based on a CCP-type plasma etching apparatus application, one example of which is illustrated in FIG. 1.

FIG. 15C illustrates semiconductor device 20 immediately before being subjected to the process carried out in the third embodiment. The third embodiment differs from the first embodiment in that the thickness of second conductive film layer 26 comprising the uneasily-etched material and being formed above insulating film 24 is relatively thicker than in the first embodiment. Second conductive film layer 26 serves as an uneasily-etched material layer as described earlier.

Other structures are substantially identical to those illustrated in FIG. 2C of the first embodiment.

Next, the process flow of the third embodiment will be described in a step by step manner. First, as shown in FIG. 15B, precoat layer 40 is formed in processing chamber 12 before semiconductor substrate 22 is loaded into the plasma etching apparatus (FIG. 20: S31). Precoat layer 40 may be formed under the conditions applied in the first embodiment.

Figure 16B:
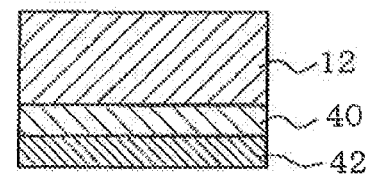
FIG. 16B is one example of an enlarged view of encircled portion P of FIG. 16A.
Figure 16A:
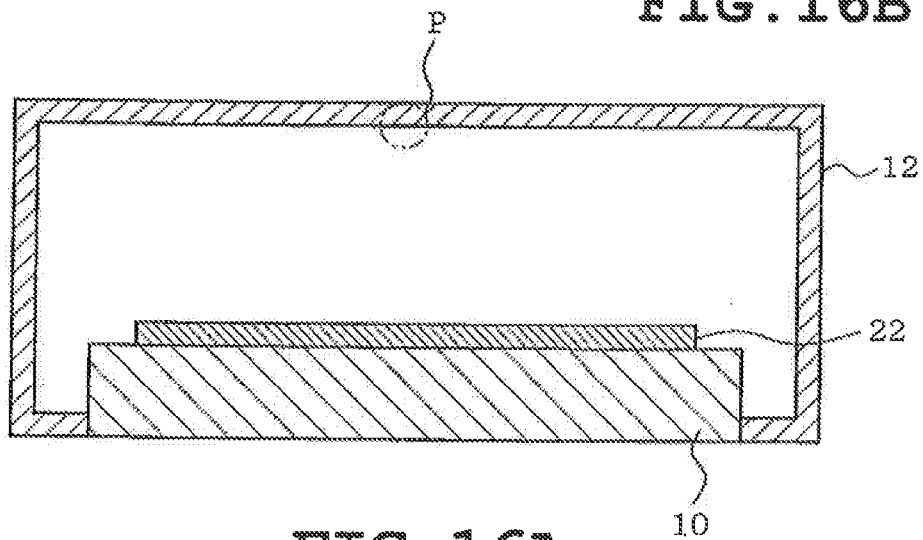
FIG. 16A is one example of a vertical cross-sectional view illustrating the plasma etching apparatus of the third embodiment in one phase of the manufacturing process flow.
Figure 16C:
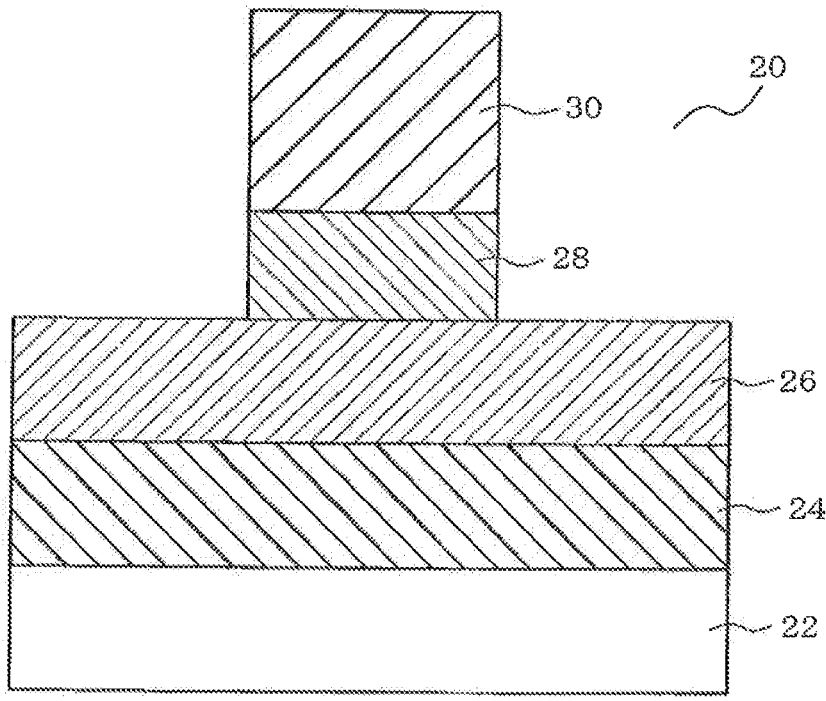
FIG. 16C is one example of a vertical cross-sectional view illustrating the semiconductor device of the third embodiment in one phase of the manufacturing process flow.

Next, semiconductor substrate 22 illustrated in FIG. 15C is loaded into processing chamber 12 (FIG. 20: S32). Then, as shown in FIG. 16C, first conductive film layer 28 is etched using etch mask layer 30 as a mask (FIG. 20: S33). The etching of first conductive film layer 28 is carried out under the conditions employed in etching first conductive film layer 28 illustrated in FIG. 3C of the first embodiment. The process is carried out in the manner described with reference to FIGS. 3A, 3B, and 3C in the first embodiment. As a result, a stack of precoat layer and reactive product 42 is deposited along the inner wall of processing chamber 12.

Figure 17B:
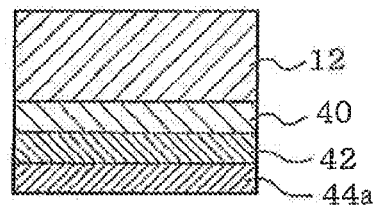
FIG. 17B is one example of an enlarged view of encircled portion P of FIG. 17A.
Figure 17A:
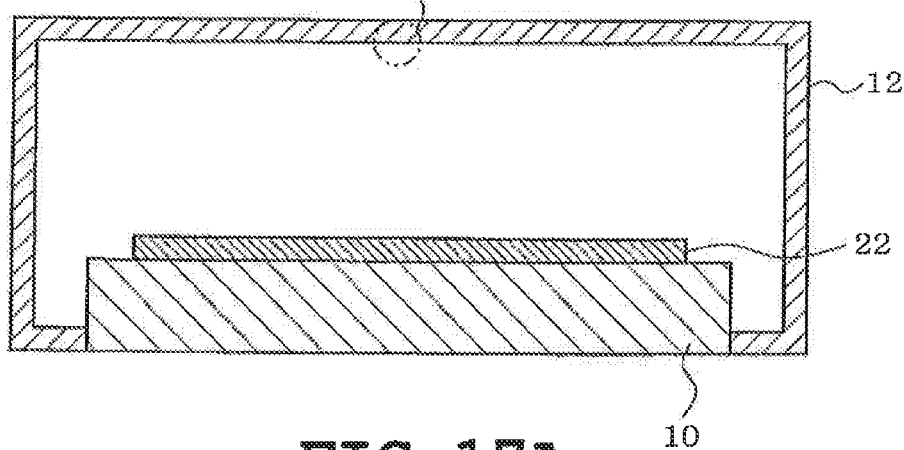
FIG. 17A is one example of a vertical cross-sectional view illustrating the plasma etching apparatus of the third embodiment in one phase of the manufacturing process flow.
Figure 17C:
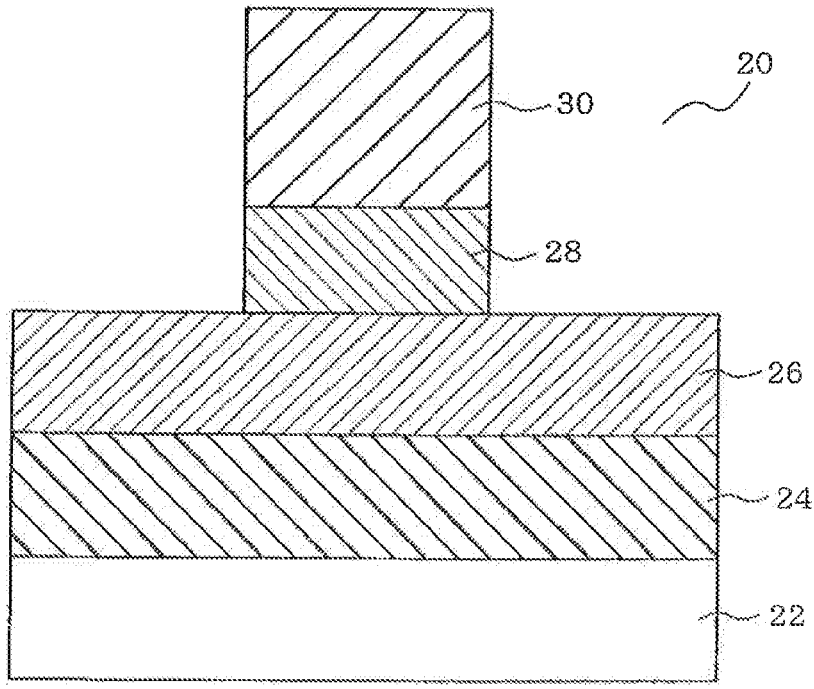
FIG. 17C is one example of a vertical cross-sectional view illustrating the semiconductor device of the third embodiment in one phase of the manufacturing process flow.

Referring now to FIG. 17C, first lift-off layer 44a is formed (FIG. 20: S34). First lift-off layer 44a may be formed under the conditions applied in forming lift-off layer 44 in the first embodiment. As a result, first lift-off layer 44a can be formed selectively along the inner wall of processing chamber 12. First lift-off layer 44a is a film primarily composed of carbon which can be removed by the later described cleaning process.

Figure 18B:
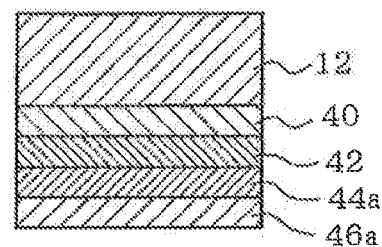
FIG. 18B is one example of an enlarged view of encircled portion P of FIG. 18A.
Figure 18A:
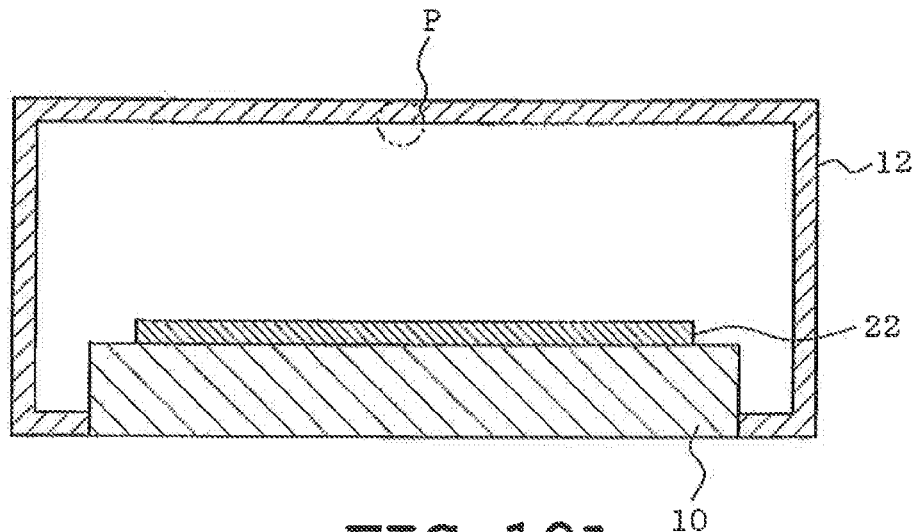
FIG. 18A is one example of a vertical cross-sectional view illustrating the plasma etching apparatus of the third embodiment in one phase of the manufacturing process flow.
Figure 18C:
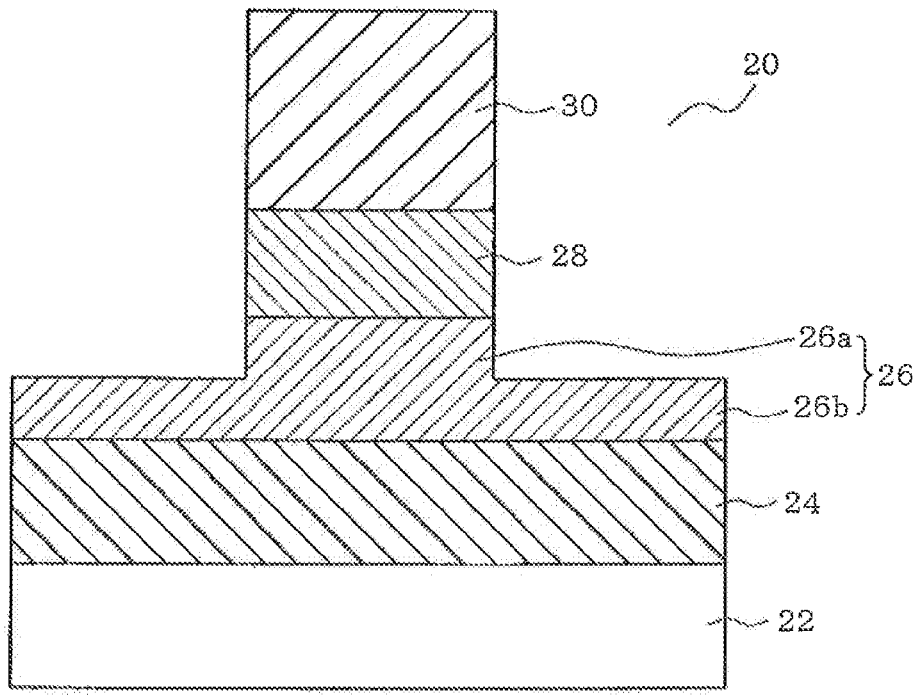
FIG. 18C is one example of a vertical cross-sectional view illustrating the semiconductor device of the third embodiment in one phase of the manufacturing process flow.

Referring now to FIG. 18C, upper portion 26a (substantially the upper half) of second conductive film layer 26 is etched (FIG. 20: S35). Second conductive film layer 26 may be etched under the conditions applied in etching second conductive film layer 26 in the first embodiment. During the etch process, second conductive film layer 26 reacts with the etch gas (including chlorine) to produce first reactive product 46a of silver and chlorine. First Reactive product 46a is deposited along the inner wall of processing chamber 12. As a result, precoat layer 40, reactive product 42, first lift-off layer 44a, and first reactive product 46a are deposited along the inner wall of processing chamber 12 so as to be stacked toward the upper layer side from the lower layer side.

Referring now to FIG. 19B, second lift-off layer 44b is formed (FIG. 20: S36). Second lift-off layer 44b may be formed under the conditions applied in forming first lift-off layer 44a. As a result, second lift-off layer 44b can be formed selectively along the inner wall of processing chamber 12. Then, lower portion 26b (substantially the lower half) of second conductive film layer 26 is etched (FIG. 20: S37). The etching may be carried out under the conditions applied in etching upper portion 26a of second conductive film layer 26. During the etch process, second reactive product 46b is produced which is deposited along the inner wall of processing chamber 12. As a result, precoat layer 40, reactive product 42, first lift-off layer 44a, first reactive product 46a, second lift-off layer 44b, and second reactive product 46b are deposited along the inner wall of processing chamber 12 so as to be stacked toward the upper layer side from the lower layer side.

First reactive product 46a and second reactive product 46b are both reactive products of second conductive film layer 26 (26a and 26b) and etch process gas. The third embodiment is described through an example in which second conductive film layer 26 comprises silver and etch process gas comprises a chlorine-containing gas. Hence, first reactive products 46a and second reactive product 46b may be primarily composed of silver chloride (AgCl). Since first reactive product 46a and second reactive product 46b have high boiling points, they are difficult to remove in the cleaning step carried out later in the process flow.

Referring now to FIG. 6A, semiconductor substrate 22 is unloaded from the plasma etching apparatus (FIG. 20: S38). Thereafter, a cleaning process is carried out under the conditions applied in the cleaning process of the first embodiment (FIG. 20: S39). In the cleaning process, second lift-off layer 44b, first lift-off layer 44a, and precoat layer can be easily removed. Thus, first reactive product 46a and second reactive product 46b which are difficult to remove by the cleaning process can be easily removed by the lift-off effect when the first lift-off layer 44a and second lift-off layer 44b are removed. As was the case in the first embodiment, reactive product 42, first lift-off layer 44a, and second lift-off layer 44b are removed by the lift-off effect when precoat layer 40 in the lower layer side is removed. In the third embodiment described above in which a thick second conductive film layer 26 is formed, etching of second conductive film layer 26 is carried out in multiple steps and the lift-off layer is formed before each step.

In case the thick second conductive film layer is etched in a single step, a thick reactive product, corresponding to first reactive product 46a and second reactive product 46b, is formed along the inner wall of processing chamber 12. This thick layer of reactive product is difficult to remove by the cleaning process. Thus, in the cleaning step, the lift-off layer located in the lower layer side of the thick reactive product layer is not easily removed since it is blocked by the thick reactive product layer. This in turn renders the removal of the thick reactive product difficult. In the third embodiment, second conductive film layer 26 is etched in multiple steps. This reduces the thickness of first reactive product 46a and second reactive product 46b and prevents formation of a thick reactive product of an uneasily-etched material. Further, first lift-off layer 44a and second lift-off layer 44b removable by the cleaning process are formed in the lower layer side of first reactive product 46a and second reactive product 46b, respectively.

As described above, formation of a thick layer of reactive product comprising an uneasily-etched material is prevented by etching second conductive film layer 26 in multiple steps. As a result, it is possible to remove first reactive product 46a and second reactive product 46b which are difficult to remove in the cleaning process. Further, by forming precoat layer 40, removable by the cleaning process in the lower layer side of reactive product 42, reactive product 42 and consequently first reactive product 46a and second reactive product 46b disposed in the upper layer side of reactive product 42 can be easily removed by the lift-off effect. In summary, the reactive product of uneasily-etched material deposited along the inner wall of processing chamber 12 can be removed more effectively. Etching of second conductive film layer 26 was carried out in two steps in the third embodiment. However, the etching may be carried out in three or more steps with a lift-off layer being formed in the lower layer side of each resulting reactive product.

Fourth Embodiment

Figure 21:
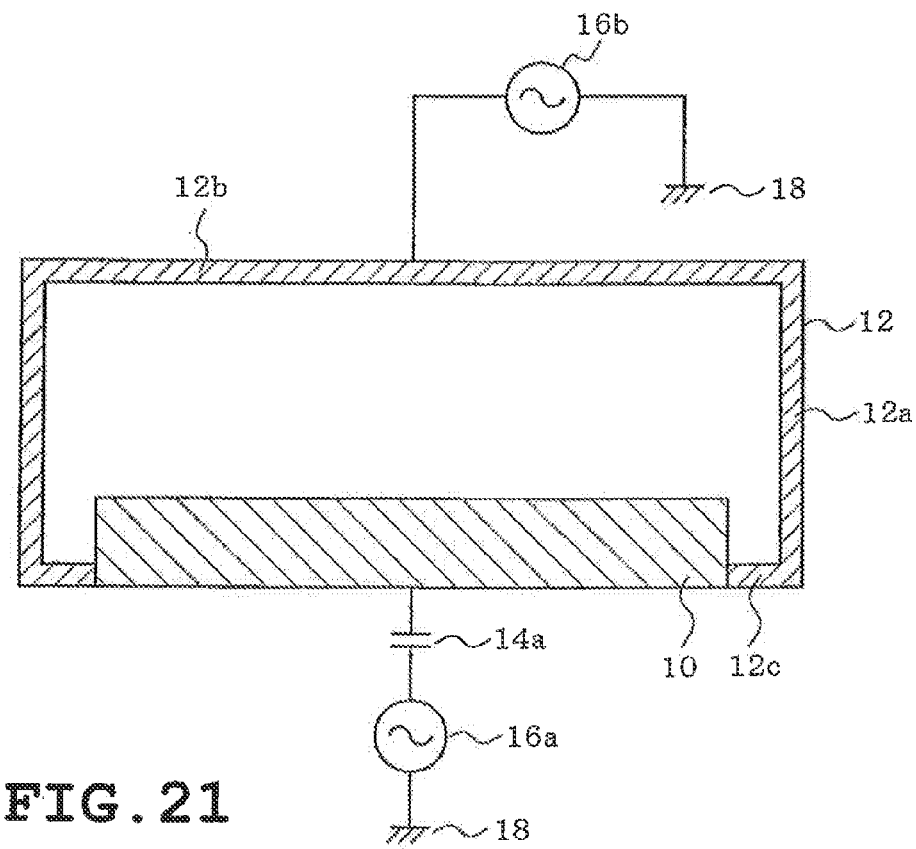
FIG. 21 is a vertical cross-sectional view schematically illustrating one example of a plasma etching apparatus used in a fourth embodiment.

The fourth embodiment employs a CCP-type plasma etching apparatus illustrated in FIG. 21. The process flow of the fourth embodiment is substantially identical to the process flows of the first, second, and third embodiments. The conditions for applying the high-frequency power supply during the formation of precoat layer 40 and lift-off layer 44 differs from those of the first, second, and third embodiments since the plasma etching apparatus used in the fourth embodiment differs in structure from the apparatus used in the first, second, and third embodiments.

FIG. 21 is a vertical cross-sectional view schematically illustrating one example of a CCP (Capacitively Coupled Plasma)-type plasma etching apparatus used in the fourth embodiment. The plasma etching apparatus used in the fourth embodiment differs from the plasma etching apparatus used in the first, second, and third embodiments in that high-frequency power supply 16b, serving as the high-frequency power supply for plasma generation, is connected to upper surface portion 12b of processing chamber 12. Other portions of the plasma etching apparatus are substantially identical to the plasma etching apparatus used in the first, second, and third embodiments.

Precoat layer 40 is formed under the following conditions in the fourth embodiment. Precoat layer 40 may be formed by using a process gas including tetrachlorosilane ($SiCl_4$) and oxygen ($O_2$). High-frequency source power may be applied to high-frequency-power supply 16b at a frequency of 13.56 MHz and voltage level of 500 W or less for example. It is possible to establish the relation of Vc≈Va (meaning that Vc and Va are substantially equal) when the source power is applied under the above described conditions. Thus, precoat layer 40 may be formed along the inner wall of processing chamber 12 by generating plasma in processing chamber 12 and causing the reaction of the process gas. For example, precoat layer 40 may be primarily composed of SiClOx. High-frequency source power is preferably applied at a voltage level of 500 W or less since, when a high-frequency power exceeding 500 W is applied, a high level of self bias occurs in the processing chamber 12 side serving as the upper electrode. This causes elevation of Va and renders the deposition of precoat layer 40 difficult.

Lift-off layer 44, including first lift-off layer 44a and second lift-off layer 44b, of the fourth embodiment may be formed under the following conditions. Lift-off layer 44 may be formed using $CH_4$/Ar as gas species and applying source power to high-frequency-power supply 16b at a frequency of 13.56 MHz and voltage level of approximately 500 W. A bias power is applied to high-frequency-power supply 16a at a frequency of 13.56 MHz and voltage level of approximately 50 W or less. Thus, it is possible to establish the relation of Vc>Va and thereby selectively form lift-off layer 44 along the inner wall of processing chamber 12.

The bias power applied to high-frequency power supply 16a is controlled to 50 W or less since a bias power of 100 W or greater for example causes semiconductor substrate 22 to be easily etched. Further, in a CCP-type plasma etching apparatus, a voltage correlated with the electrode area ratio is distributed to the stage 10 side, i.e. cathode side when source power is applied to processing chamber 12 side, i.e. upper electrode side. Thus, it is preferable to apply relatively lower bias power to high-frequency-power supply 16a of CCP-type plasma apparatus as compared to a high-frequency power supply of a later described ICP-type plasma etching apparatus.

Fifth Embodiment

Figure 22:
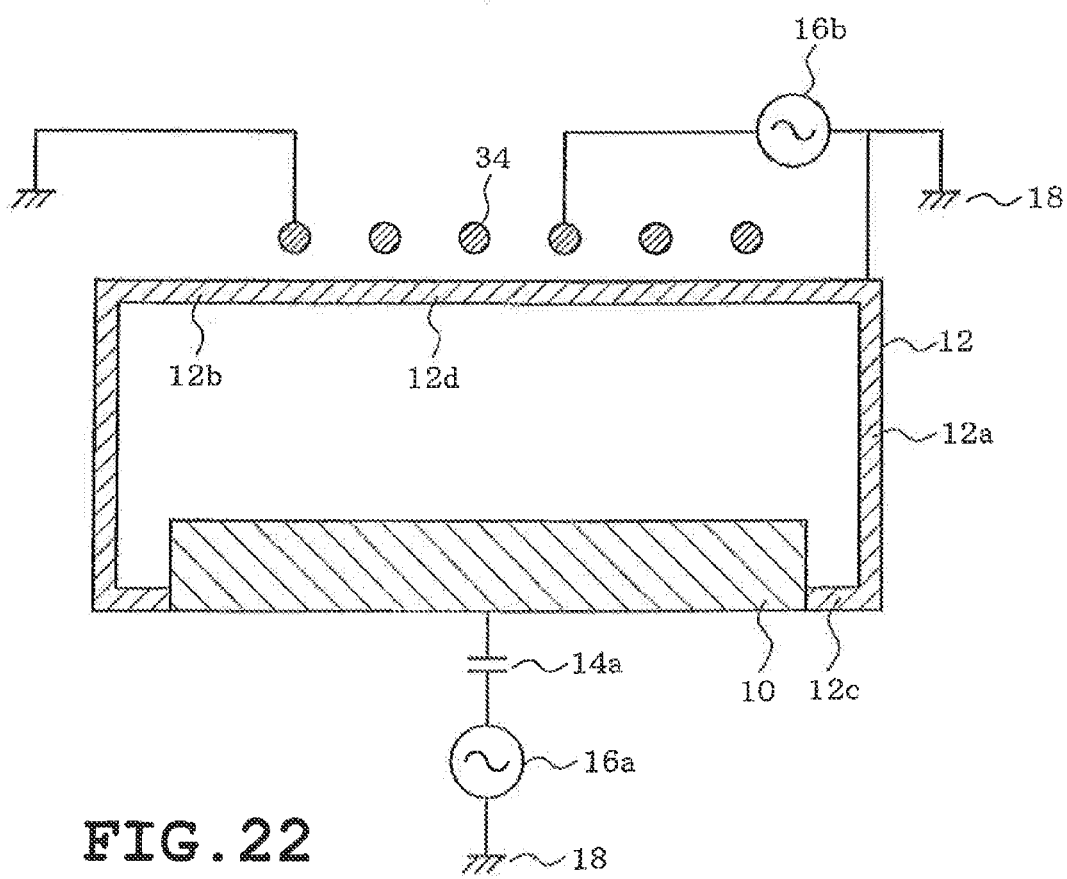
FIG. 22 is a vertical cross-sectional view schematically illustrating one example of a plasma etching apparatus used in a fifth embodiment.

In the fifth embodiment, an ICP (Inductive Coupled Plasma)-type plasma etching apparatus illustrated in FIG. 22 is used as an etching apparatus. The process flow of the fifth embodiment is substantially identical to the process flows of the first, second, and third embodiments. The conditions for applying the high-frequency power supply during the formation of precoat layer 40 and lift-off layer 44 differs from those of the first, second, and third embodiments since the plasma etching apparatus used in the fifth embodiment differs in structure from the apparatus used in the first, second, and third embodiments.

FIG. 22 is a vertical cross-sectional view schematically illustrating one example of an ICP-type plasma etching apparatus used in the fifth embodiment. The plasma etching apparatus includes processing chamber 12. Processing chamber 12 may be made of for example a surface-anodized aluminum. Processing chamber 12 is shaped like a cylinder for example and includes sidewall portion 12a, upper surface portion 12b, and bottom surface portion 12c. Upper surface portion 12b of processing chamber 12 is connected to earth 18. The interior of processing chamber 12 is sealed airtight. In an alternative embodiment, processing chamber 12 may have a floating potential. The interior of processing chamber 12 is sealed airtight. In upper surface portion 12b, window 12d is provided which is formed for example of quartz. On the upper surface of window 12d, induction antenna 34 is provided which comprises for example a spiral coil.

Window 12d seals the upper portion of processing chamber 12 (plasma processing chamber) airtight and serves as an induction window allowing transmission of induction magnetic field produced by induction antenna 34 into processing chamber 12. One end of induction antenna 34 is connected to high-frequency power source 16b for applying source bias and the other end is connected to earth 18. High-frequency power source 16b is connected to earth 18. The coil of induction antenna 34 may be arranged for example in a double spiral.

Stage 10 is disposed inside processing chamber 12. Stage has blocking capacitor 14a and high-frequency power supply 16a series connected to it. High-frequency power supply 16a is connected to earth 18. High-frequency power supply 16a is a high-frequency power supply for supplying bias power. Stage 10 serves as a lower electrode of the plasma etching apparatus and is made of for example a conductive material such as aluminum or stainless steel. Stage 10 is surrounded by an insulating member not shown. Thus, stage 10 is insulated from processing chamber 12. Stage 10 serves as a cathode during plasma processing. Stage comprises an electrostatic chuck. Semiconductor substrate 22 sticks to the electrostatic chuck by Coulomb force and is thereby held by the electrostatic chuck during the etch process.

The above briefly describes the plasma etching apparatus used in the fifth embodiment. Precoat layer 40 is formed under the following conditions in the fifth embodiment. Precoat layer may be formed by using a process gas including tetrachlorosilane ($SiCl_4$) and oxygen ($O_2$). High-frequency source power may be applied to high-frequency-power supply 16b at a frequency of 13.56 MHz and voltage level ranging from 1000 to 2000 W for example. It is possible to establish the relation of Vc≈Va (meaning that Vc and Va are substantially equal) when the source power is applied under the above described conditions. Thus, precoat layer 40 may be formed along the inner wall of processing chamber 12 by generating plasma in processing chamber 12 and causing the reaction of the process gas. For example, precoat layer 40 may be primarily composed of SiClOx.

Lift-off layer 44, including first lift-off layer 44a and second lift-off layer 44b, of the fifth embodiment may be formed under the following conditions. Lift-off layer 44 may be formed using $CH_4$/Ar as gas species for example and applying source power to high-frequency-power supply 16b at a frequency of 13.56 MHz and voltage level ranging from 1000 to 2000 W. A bias power is applied to high-frequency-power supply 16a at a frequency of 13.56 MHz and voltage level ranging from 50 to 100 W for example. Thus, it is possible to establish the relation of Vc>Va and thereby selectively form lift-off layer 44 along the inner wall of processing chamber 12. The bias power applied to high-frequency power supply 16a is controlled range from 50 to 100 W since a bias power of 200 W or greater for example causes semiconductor substrate 22 to be easily etched. Processing chamber 12 may be connected (i.e. grounded) to earth 18 or may have a floating potential.

Other Embodiments

The foregoing embodiments were described through CCP-type and ICP-type plasma etching apparatus application. However, other embodiments may be directed to ECR (Electron Cyclotron Resonance)-type, helicon-wave type, or other types of plasma etching apparatuses. Any type of etching apparatus may be used as long as the relation of Vc≈Va holds in the formation of precoat layer 40 and the relation of Vc>Va holds in the formation of lift-off layer 44 by increasing the difference in the level of self bias applied over stage 10 and over the inner wall of processing chamber 12 as compared to the formation of precoat layer 40. The foregoing embodiments were described through examples of plasma etching apparatuses provided with two power supplies, namely high-frequency power supply 16a and high-frequency power supply 16b. However, a plasma etching apparatus provided with a single high-frequency power supply may be used instead.

Reactive product 46 (including 46a and 46b) may be a film comprising a mixture of a reactive product of uneasily-etched material and halogen and material(s) such as metal, alloy, semiconductor, oxide, nitride, carbide, silicide, or the like.

The foregoing embodiments may be applied to a manufacturing process flow of a NAND/NOR flash memory, EEPROM, DRAM, SRAM, other types of semiconductor storage devices, or logic devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device including processing a semiconductor substrate using a plasma etching apparatus provided with a processing chamber, the semiconductor substrate having an uneasily-etched material formed thereabove and at least an upper layer film formed above the uneasily-etched material, the method comprising:
   etching the upper layer film after loading the semiconductor substrate into the processing chamber and causing deposition of a reactive product of the upper layer film along an inner wall of the processing chamber;
   forming a lift-off layer selectively along the inner wall of the processing chamber and not along the semiconductor substrate with the semiconductor substrate loaded in the processing chamber;
   etching the uneasily-etched material and causing deposition of a reactive product of the uneasily-etched material along the lift-off layer; and
   cleaning, by removing the lift-off layer, the inner wall of the processing chamber after the semiconductor substrate is unloaded from the plasma etching apparatus, the cleaning of the inner wall of the processing chamber including removing the reactive product of the uneasily-etched material and the reactive product of the upper layer film.

2. The method according to claim 1, wherein the uneasily-etched material includes at least one material selected from the group consisting of silver, iron, cobalt, nickel, copper, chrome, manganese, magnesium, platinum, gold, and iridium.

3. The method according to claim 1, wherein the upper layer film includes a layer comprising at least one material selected from the group consisting of tungsten, molybdenum, titanium, and aluminum.

4. The method according to claim 1, wherein forming the lift-off layer includes forming plasma in the processing chamber so that Vc>Va is satisfied when Vc represents a potential difference between a stage configured to place the semiconductor substrate and the plasma and Va represents a potential difference between the processing chamber and the plasma.

5. The method according to claim 1, wherein the plasma etching apparatus is a capacitively-coupled type plasma etching apparatus.

6. The method according to claim 1, wherein the plasma etching apparatus is an inductively-coupled type plasma etching apparatus.

7. A method of manufacturing a semiconductor device including processing a semiconductor substrate using a plasma etching apparatus provided with a processing chamber, the semiconductor substrate having at least a conductive film and an uneasily-etched material formed thereabove, the method comprising:
   forming a precoat layer along an inner wall of the processing chamber;
   etching the conductive film after loading the semiconductor substrate into the processing chamber, and causing deposition of a reactive product of the conductive film along the precoat layer;
   forming a lift-off layer selectively along the inner wall of the processing chamber and not along the semiconductor substrate with the semiconductor substrate loaded in the processing chamber;
   etching the uneasily-etched material and causing deposition of a reactive product of the uneasily-etched material along the lift-off layer; and
   cleaning, by removing the reactive product of the uneasily-etched material and the reactive product of the conductive film by removing the lift-off layer and the precoat layer, the inner wall of the processing chamber after the semiconductor substrate is unloaded from the plasma etching apparatus.

8. The method according to claim 7, wherein the conductive film includes at least one material selected from the group consisting of tungsten, molybdenum, titanium, and aluminum.

9. The method according to claim 7, wherein the uneasily-etched material includes at least one material selected from the group consisting of silver, iron, cobalt, nickel, copper, chrome, manganese, magnesium, platinum, gold, and iridium.

10. The method according to claim 7, wherein forming the lift-off layer includes forming plasma in the processing chamber so that Vc>Va is satisfied when Vc represents a potential difference between a stage configured to place the semiconductor substrate and the plasma and Va represents a potential difference between the processing chamber and the plasma.

11. The method according to claim 7, wherein forming the precoat layer includes forming plasma in the processing chamber so that Vc is substantially equal to Va when Vc represents a potential difference between a stage configured to place the semiconductor substrate and the plasma and Va represents a potential difference between the processing chamber and the plasma.

12. The method according to claim 7, wherein the plasma etching apparatus is a capacitively-coupled type plasma etching apparatus.

13. The method according to claim 7, wherein the plasma etching apparatus is an inductively-coupled type plasma etching apparatus.

14. A method of manufacturing a semiconductor device including processing a semiconductor substrate using a plasma etching apparatus provided with a processing chamber, the semiconductor substrate having at least an uneasily-etched material formed thereabove, the method comprising:
   forming a first lift-off layer selectively along an inner wall of the processing chamber and not along the semiconductor substrate with the semiconductor substrate loaded in the processing chamber;
   etching an upper portion of the uneasily-etched material and causing deposition of a reactive product of the uneasily-etched material of the upper portion along the first lift-off layer;
   forming a second lift-off layer selectively along the inner wall of the processing chamber and not along the semiconductor substrate with the semiconductor substrate loaded in the processing chamber;
   etching a lower portion of the uneasily-etched material and causing deposition of a reactive product of the uneasily-etched material of the lower portion along the second lift-off layer; and
   cleaning, by removing the reactive product of the uneasily-etched material by removing the first and the second lift-off layers, the inner wall of the processing chamber after the semiconductor substrate is unloaded from the plasma etching apparatus.

15. The method according to claim 14, wherein the uneasily-etched material includes at least one material selected from the group consisting of silver, iron, cobalt, nickel, copper, chrome, manganese, magnesium, platinum, gold, and iridium.

16. The method according to claim 14, wherein an upper portion and a lower portion of the uneasily-etched material include different materials.

17. The method according to claim 14, wherein an upper portion and a lower portion of the uneasily-etched material include the same material.

18. The method according to claim 14, wherein forming the first and the second lift-off layers includes forming plasma in the processing chamber so that Vc>Va is satisfied when Vc represents a potential difference between a stage configured to place the semiconductor substrate and the plasma and Va represents a potential difference between the processing chamber and the plasma.

19. The method according to claim 14, wherein the plasma etching apparatus is a capacitively-coupled type plasma etching apparatus.

20. The method according to claim 14, wherein the plasma etching apparatus is an inductively-coupled type plasma etching apparatus.

* * * * *